(12) United States Patent
Zhang et al.

(10) Patent No.: US 12,666,820 B2
(45) Date of Patent: Jun. 23, 2026

(54) DISPLAY PANEL AND DISPLAY DEVICE COMPRISING SHARED GATE CONDUCTIVE LAYER FOR OPPOSING ACTIVE LAYER

(71) Applicants: Chengdu BOE Optoelectronics Technology Co., Ltd., Chengdu (CN); BOE Technology Group Co., Ltd., Beijing (CN)

(72) Inventors: Tiaomei Zhang, Beijing (CN); Tianyi Cheng, Beijing (CN); Zhongliu Yang, Beijing (CN); Zhiliang Jiang, Beijing (CN); Ming Hu, Beijing (CN); Haijun Qiu, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 436 days.

(21) Appl. No.: 18/027,623

(22) PCT Filed: Jun. 30, 2022

(86) PCT No.: PCT/CN2022/102925
§ 371 (c)(1),
(2) Date: Mar. 21, 2023

(87) PCT Pub. No.: WO2024/000442
PCT Pub. Date: Jan. 4, 2024

(65) Prior Publication Data
US 2024/0306445 A1 Sep. 12, 2024

(51) Int. Cl.
*H10K 59/131* (2023.01)
*G09G 3/3233* (2016.01)
(Continued)

(52) U.S. Cl.
CPC ......... *H10K 59/131* (2023.02); *H10D 86/471* (2025.01); *H10K 59/1213* (2023.02);
(Continued)

(58) Field of Classification Search
CPC ......... H10D 86/471; G09G 2300/0426; H10K 59/131–1315
See application file for complete search history.

(56) References Cited

U.S. PATENT DOCUMENTS 10,276,607 B2    4/2019  Lou et al.
10,340,320 B2    7/2019  Lee et al.
(Continued)

FOREIGN PATENT DOCUMENTS

CN    106847834 A    6/2017
CN    107452757 A    12/2017
(Continued)

OTHER PUBLICATIONS

Written Opinion of the International Searching Authority issued in Application No. PCT/CN2022/102925, dated Jan. 5, 2023, with English translation, (4p).
(Continued)

*Primary Examiner* — Christine S. Kim
*Assistant Examiner* — Tyler J Wiegand
(74) *Attorney, Agent, or Firm* — Arch & Lake LLP

(57) ABSTRACT

A display panel includes a pixel driving circuit including a first type transistor and a second type transistor, the display panel further includes a base substrate, a first active layer located on a side of the base substrate, a second active layer located on the side of the first active layer away from the base substrate, a first conductive layer located between the first active layer and the second active layer; at least partial structure of the first active layer is used to form a channel region of the first type transistor; at least partial structure of
(Continued)

the second active layer is used to form the channel region of the second type transistor; partial structure of the first conductive layer is used to form the gate of the first type transistor, partial structure of the first conductive layer is used to form the bottom gate of the second type transistor.

17 Claims, 19 Drawing Sheets

(51) Int. Cl.
  *H10D 86/40* (2025.01)
  *H10K 59/121* (2023.01)
(52) U.S. Cl.
  CPC ... *G09G 3/3233* (2013.01); *G09G 2300/0426* (2013.01); *G09G 2300/0819* (2013.01); *G09G 2300/0842* (2013.01); *G09G 2300/0861* (2013.01)

(56) References Cited

U.S. PATENT DOCUMENTS

| | | |
|---|---|---|
| 11,263,965 B2 | 3/2022 | Yoon et al. |
| 2018/0219032 A1 | 8/2018 | Lou et al. |
| 2021/0013280 A1 | 1/2021 | Choi et al. |
| 2021/0343234 A1 | 11/2021 | Yoon et al. |
| 2022/0130933 A1* | 4/2022 | Yu .......................... H10D 86/60 |

FOREIGN PATENT DOCUMENTS

| | | | |
|---|---|---|---|
| CN | 110335564 A | 10/2019 | |
| CN | 112436020 A | 3/2021 | |
| CN | 112885850 A | 6/2021 | |
| CN | 113241368 A | 8/2021 | |
| CN | 113571017 A | 10/2021 | |
| CN | 113793568 A | 12/2021 | |
| CN | 114220772 A | 3/2022 | |
| KR | 102339644 B1 | 12/2021 | |
| WO | WO-2021226807 A1 * | 11/2021 | ............. H10D 86/60 |
| WO | 2022160873 A1 | 8/2022 | |

OTHER PUBLICATIONS

The extended European Search Report issued in Application No. 22948547.9 dated Mar. 5, 2025, (7p).

First Office Action of Indian Application No. 202417058359 dated Feb. 27, 2026, (8p).

* cited by examiner

DISPLAY PANEL AND DISPLAY DEVICE COMPRISING SHARED GATE CONDUCTIVE LAYER FOR OPPOSING ACTIVE LAYER

CROSS REFERENCE

The present disclosure is a National Stage of International Application No. PCT/CN2022/102925, filed on Jun. 30, 2022, the entire contents of which are incorporated herein by reference.

TECHNICAL FIELD

The present disclosure relates to the field of display technology, and in particular, to a display panel and a display device.

BACKGROUND

In LTPO (Low temperature polycrystalline TFT+Oxide TFT) technology, the display panel generally includes a first gate layer, a second gate layer, and a third gate layer stacked in sequence, and the second gate layer is located between the first gate layer and the third gate layer. The first gate layer is used to form the gate of the P-type transistor, the second gate layer is used to form the bottom gate of the N-type transistor, and the third gate layer is used to form the top gate of the N-type transistor.

It should be noted that the information disclosed in the above background section is only for enhancing the understanding of the background of the present disclosure, and therefore may include information that does not constitute the related art known to those of ordinary skill in the art.

SUMMARY

According to an aspect of the present disclosure, there is provided a display panel, the display panel includes a pixel driving circuit, the pixel driving circuit includes a first type transistor and a second type transistor, and the display panel further includes: a base substrate, a first active layer, a second active layer and a first conductive layer. The first active layer is located on a side of the base substrate, and at least partial structure of the first active layer is used to form a channel region of the first type transistor; the second active layer is located on a side of the first active layer away from the base substrate, and at least partial structure of the second active layer is used to form a channel region of the second type transistor; the first conductive layer is located between the first active layer and the second active layer, partial structure of the first conductive layer is used to form a gate of the first type transistor, and partial structure of the first conductive layer is used to form a bottom gate of the second type transistor In some embodiments of the present disclosure, the pixel driving circuit further includes a driving transistor and an eighth transistor, a first electrode of the eighth transistor is connected to a third initial signal line, and a second electrode of the eighth transistor is connected to a first electrode of the driving transistor.

In some embodiments of the present disclosure, the pixel driving circuit further includes a capacitor, the first conductive layer includes a first conductive part, and the first conductive part is used to form a first electrode of the capacitor. The display panel further includes a second conductive layer located on a side of the second active layer away from the base substrate, the second conductive layer includes a third conductive part, an orthographic projection of the third conductive part on the base substrate at least partially overlaps with an orthographic projection of the first conductive part on the base substrate, and the third conductive part is used to form a second electrode of the capacitor; where, partial structure of the second conductive layer is further used to form a top gate of the second type transistor.

In some embodiments of the present disclosure, the pixel driving circuit further includes a driving transistor, a first transistor and a second transistor, the driving transistor is the first type transistor, and the first transistor and the second transistor are second type transistors; a first electrode of the first transistor is connected to a first initial signal line, a second electrode of the first transistor is connected to a gate of the driving transistor, a first electrode of the second transistor is connected to the gate of the driving transistor, a second electrode of the second transistor is connected to a second electrode of the driving transistor, and the first electrode of the capacitor is connected to the gate of the driving transistor; the first active layer includes a third active part used to form a channel region of the driving transistor; the second active layer includes a first active part and a second active part, the first active part is used to form a channel region of the first transistor, and the second active part is used to forming a channel region of the second transistor; the first conductive layer includes a first conductive part, a first gate line and a first reset signal line; where, an orthographic projection of the first conductive part on the base substrate covers an orthographic projection of the third active part on the base substrate, and the first conductive part is used to form the gate of the driving transistor and the first electrode of the capacitor; an orthographic projection of the first reset signal line on the base substrate covers an orthographic projection of the first active part on the base substrate, and partial structure of the first reset signal line is used to form a bottom gate of the first transistor; an orthographic projection of the first gate line on the base substrate covers an orthographic projection of the second active part on the base substrate, and partial structure of the first gate line is used to form a bottom gate of the second transistor; the second conductive layer includes a third conductive part, a third gate line and a third reset signal line; where, an orthographic projection of the third conductive part on the base substrate at least partially overlaps with the orthographic projection of the first conductive part on the base substrate, and the third conductive part is used to form the second electrode of the capacitor; an orthographic projection of the third reset signal line on the base substrate covers the orthographic projection of the first active part on the base substrate, and partial structure of the third reset signal line is used to form a top gate of the first transistor; an orthographic projection of the third gate line on the base substrate covers the orthographic projection of the second active part on the base substrate, and partial structure of the third gate line is used to form the bottom gate of the second transistor.

In some embodiments of the present disclosure, the pixel driving circuit further includes a fourth transistor, a first electrode of the fourth transistor is connected to a data line, a second electrode of the fourth transistor is connected to a first electrode of the driving transistor, and the fourth transistor is the first type transistor; the first active layer further includes a fourth active part used to form a channel region of the fourth transistor; the first conductive layer further includes a second gate line, an orthographic projection of the second gate line on the base substrate covers an orthographic projection of the fourth active part on the base substrate, and partial structure of the second gate line is used to form a gate of the fourth transistor; where, the orthographic projection of the first gate line on the base substrate, the orthographic projection of the second gate line on the base substrate, and the orthographic projection of the first reset signal line on the base substrate all extend along a first direction; the orthographic projection of the second gate line on the base substrate is located on a side of the orthographic projection of the first gate line on the base substrate away from the orthographic projection of the first conductive part on the base substrate; the orthographic projection of the first reset signal line on the base substrate is located on a side of the orthographic projection of the second gate line on the base substrate away from the orthographic projection of the first conductive part on the base substrate.

In some embodiments of the present disclosure, the first gate line includes more than one first gate line segment, and orthographic projections of more than one first gate line segment in a same first gate line extend along the first direction and are distributed at intervals along the first direction; the second active layer further includes a fifteenth active part connected between the first active part and the second active part; the first conductive layer further includes a second conductive part, an orthographic projection of the second conductive part on the base substrate extends along a second direction and is located between orthographic projections of two first gate line segments adjacent in the first direction on the base substrate, the second direction intersects with the first direction, and the second conductive part is respectively connected to the fifteenth active part and the first conductive part; the display panel further includes a third conductive layer located on a side of the second conductive layer away from the base substrate, the third conductive layer includes a first gate connection line, an orthographic projection the first gate connection line on the base substrate extends along the first direction and intersects with the orthographic projection of the second conductive part on the base substrate, and the first gate connection line is connected to the more than one first gate line segment in the same first gate line respectively through a via hole.

In some embodiments of the present disclosure, the first gate line includes more than one first gate line segment, and orthographic projections of more than one first gate line segment in a same first gate line on the base substrate extend along the first direction and are distributed at intervals along the first direction; the second active layer further includes a fifteenth active part connected between the first active part and the second active part; the display panel further includes a third conductive layer located on a side of the second conductive layer away from the base substrate, the third conductive layer includes a first gate connection line segment and a fourth bridging part, an orthographic projection of the fourth bridging part on the base substrate extends along a second direction, the second direction intersects with the first direction, and the fourth bridging part is connected to the fifteenth active part and the first conductive part respectively through a via hole; where, the orthographic projection of the fourth bridging part on the base substrate intersects with an orthographic projection of the first gate line segment on the base substrate, an orthographic projection on the first gate connection line segment on the base substrate is located between orthographic projections of two fourth bridging parts adjacent in the first direction on the base substrate, and the first gate connection line segment is connected between two first gate line segments adjacent in first direction.

In some embodiments of the present disclosure, the first gate line includes more than one first gate line segment, and orthographic projections of more than one first gate line segment in a same first gate line on the base substrate extend along the first direction and are distributed at intervals along the first direction; the second conductive layer includes a third gate line, an orthographic projection of the third gate line on the base substrate extends along the first direction, and the third gate line is connected to more than one first gate line segment in the same first gate line through a via hole.

In some embodiments of the present disclosure, the display panel further includes a third conductive layer located on a side of the second conductive layer away from the base substrate, the third conductive layer includes a tenth bridging part, and the tenth bridging part is connected between the fourth active part and the third active part; the orthographic projection of the first gate line on the base substrate intersects with an orthographic projection of the tenth bridging part on the base substrate.

In some embodiments of the present disclosure, the third gate line includes more than one third gate line segment, and orthographic projections of more than one third gate line segment in a same third gate line on the base substrate extend along the first direction and are distributed at intervals along the first direction; the display panel further includes a third conductive layer located on a side of the second conductive layer away from the base substrate, the third conductive layer includes a first gate connection line, an orthographic projection of the first gate connection line on the base substrate extends along the first direction, and the first gate connection line is connected to the more than one third gate line segment in the same third gate line respectively through a via hole.

In some embodiments of the present disclosure, a sheet resistance of the third conductive layer is smaller than a sheet resistance of the first conductive layer; the sheet resistance of the third conductive layer is smaller than a sheet resistance of the second conductive layer.

In some embodiments of the present disclosure, the display panel further includes a buffer layer and a second insulation layer; the buffer layer is located between the first conductive layer and the second active layer; the second insulation layer is located between the second active layer and the second conductive layer; where, a thickness of the second insulation layer between the first conductive part and the third conductive part is smaller than a thickness of the second insulation layer between the top gate and the bottom gate of the second type transistor; and/or, a thickness of the buffer layer between the first conductive part and the third conductive part is smaller than a thickness of the buffer layer between the top gate and the bottom gate of the second type transistor.

In some embodiments of the present disclosure, the display panel further includes a fan-out region and more than one data line, the first conductive layer further includes a first data fan-out line located in the fan-out region, and the first data fan-out line is connected to a data line corresponding to the first data fan-out line; the second conductive layer also includes a second data fan-out line located in the fan-out region, and the second data fan-out line is connected to a data line corresponding to the second data fan-out line.

In some embodiments of the present disclosure, the pixel driving circuit includes a driving transistor and a fourth transistor, a first electrode of the fourth transistor is connected to a data line, a second electrode of the fourth transistor is connected to a first electrode of the driving transistor, the first electrode of the capacitor is connected to a gate of the driving transistor, and the second electrode of the capacitor is connected to a third power line; the first active layer includes a third active part, a fourth active part and a nineteenth active part, the third active part is used to form a channel region of the driving transistor, the fourth active part is used to form a channel region of the fourth transistor, the nineteenth active part is connected between the third active part and the fourth active part, and a size of a orthographic projection of the nineteenth active part on the base substrate in the first direction is larger than a size of an orthographic projection of the fourth active part on the base substrate in the first direction; the second conductive layer includes a third conductive part and a fourth conductive part, the third conductive part is used to form the second electrode of the capacitor, the fourth conductive part is connected to the third conductive part, and an orthographic projection of the fourth conductive part on the base substrate at least partially overlaps with an orthographic projection of the nineteenth active part on the base substrate.

In some embodiments of the present disclosure, the display panel includes a light emitting unit located in a display region, and the pixel driving circuit includes a driving transistor, a first transistor, a seventh transistor and an eighth transistor; the pixel driving circuit is connected to a first electrode of the light emitting unit, and a second electrode of the light emitting unit is connected to a first power line; a first electrode of the first transistor is connected to a first initial signal line, and a second electrode of the first transistor is connected to a gate of the driving transistor; a first electrode of the seventh transistor is connected to a second initial signal line, and a second electrode of the seventh transistor is connected to the first electrode of the light emitting unit; a first electrode of the eighth transistor is connected to a third initial signal line, and a second electrode of the eighth transistor is connected to a first electrode of the driving transistor; the display panel further includes more than one first signal line and more than one second signal line, more than one first signal line is located in the display region of the display panel, an orthographic projection of the first signal line on the base substrate extends along a first direction; more than one second signal line is located in the display region of the display panel, an orthographic projection of the second signal line on the base substrate extends along a second direction, the second direction intersects with the first direction, and at least part of the second signal line is connected to at least part of the first signal line that intersects with the orthographic projection of the second signal line on the base substrate through a via hole; the first signal line includes at least one of the first power line, the first initial signal line, the second initial signal line and the third initial signal line, a same second signal line is connected to a same one of the first signal line, and the second signal line is connected to at least one of the first power line, the first initial signal line, the second initial signal line, and the third initial signal line.

In some embodiments of the present disclosure, the pixel driving circuit further includes a fourth transistor, a driving transistor and a fifth transistor, a first electrode of the fifth transistor is connected to a third power line, and a second electrode of the fifth transistor is connected to the first electrode of the driving transistor, a first electrode of the fourth transistor is connected to a data line, and a second electrode of the fourth transistor is connected to the first electrode of the driving transistor; the display panel further includes a fourth conductive layer located on a side of the second active layer away from the base substrate, the fourth conductive layer includes the data line, the third power line and the second signal line; where, an orthographic projection of the data line on the base substrate and an orthographic projection of the third power line on the base substrate extend along the second direction, and in a same column of pixel driving circuits, an orthographic projection of the second signal line located in the fourth conductive layer on the base substrate is located between the orthographic projection of the data line on the base substrate and the orthographic projection of the third power line on the base substrate.

In some embodiments of the present disclosure, the display panel includes more than one repeating unit distributed in an array along a first direction and a second direction, and the first direction intersects with the second direction; each repeating unit includes two pixel driving circuits distributed along the first direction, and two pixel driving circuits in a same repeating unit are mirror-symmetrically provided.

In some embodiments of the present disclosure, the first direction is a row direction, the second direction is a column direction, the pixel driving circuit includes a driving transistor, the first electrode of the capacitor is connected to a gate of the driving transistor, and the second electrode of the capacitor is connected to a third power line; the display panel further includes a fourth conductive layer located on a side of the second conductive layer away from the base substrate, the fourth conductive layer includes the third power line, and each column of the pixel driving circuits is correspondingly provided with one third power line, the third power line includes a first extension part, a second extension part and a third extension part, and the second extension part is connected between the first extension part and the third extension part; a size of an orthographic projection of the second extension part on the base substrate in the row direction is larger than a size of an orthographic projection of the first extension part on the base substrate in the row direction, and the size of the orthographic projection of the second extension part on the base substrate in the row direction is larger than a size of an orthographic projection of the third extension part on the base substrate in the row direction; where, in a same repeating unit, second extension parts in two adjacent third power lines are connected to each other, and two adjacent third conductive parts in two repeating units adjacent in the row direction are connected to each other.

In some embodiments of the present disclosure, the display panel includes more than one pixel driving circuit, and the more than one pixel driving circuit is distributed in an array along a first direction and a second direction, and the first direction intersects with the second direction; the pixel driving circuit further includes a fifth transistor, a first electrode of the fifth transistor is connected to a third power line, a second electrode of the fifth transistor is connected to a first electrode of the driving transistor, and the display panel further includes a third conductive layer and a fourth conductive layer, the third conductive layer is located on a side of the second conductive layer away from the base substrate, the third conductive layer includes a power connection line, an orthographic projection of the power connection line on the base substrate extends along the first direction, the power connection line is connected to more than one third conductive part respectively through a via hole, and orthographic projections of more than one third conductive part connected to a same power connection line on the base substrate are distributed at intervals along the first direction; the fourth conductive layer is located on a side of the third conductive layer away from the base substrate, the fourth conductive layer includes the third power line, an orthographic projection the third power line on the base substrate extends along the second direction, and the third power line is connected to the power connection line that intersects with the orthographic projection of the third power line on the base substrate.

In some embodiments of the present disclosure, the display panel further includes a light emitting unit, and the pixel driving circuit further includes a fourth transistor, a fifth transistor, a sixth transistor, a seventh transistor and an eighth transistor; a first electrode of the fourth transistor is connected to a data line, and a second electrode of the fourth transistor is connected to a first electrode of the driving transistor; a first electrode of the fifth transistor is connected to a third power line, and a second electrode of the fifth transistor is connected to the first electrode of the driving transistor; a first electrode of the sixth transistor is connected to a second electrode of the driving transistor, and a second electrode of the sixth transistor is connected to a first electrode of the light emitting unit; a first electrode of the seventh transistor is connected to a second initial signal line, and a second electrode of the seventh transistor is connected to the first electrode of the light emitting unit; a first electrode of the eighth transistor is connected to a third initial signal line, and a second electrode of the eighth transistor is connected to the first electrode of the driving transistor; the fourth transistor, the fifth transistor, the sixth transistor, the seventh transistor, and the eighth transistor are first type transistors; the first type transistor is a P-type transistor, and the second type transistor is an N-type transistor.

According to one aspect of the present disclosure, there is provided a display device, which includes the above-mentioned display panel.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of the description, illustrate embodiments consistent with the disclosure and together with the description serve to explain the principles of the disclosure. Obviously, the drawings in the following description are some embodiments of the present disclosure, and for those of ordinary skill in the art, other drawings can also be obtained from these drawings without creative efforts.

DETAILED DESCRIPTION

Figure 1:
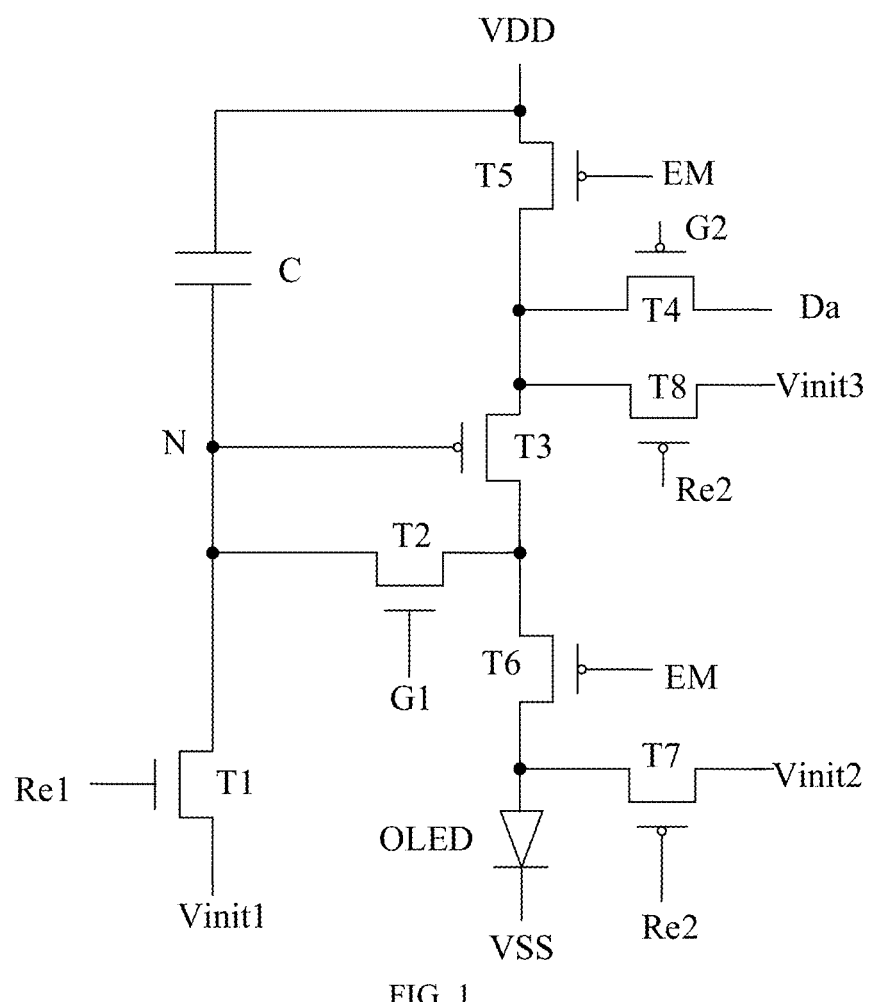
FIG. 1 is a schematic structural diagram of a pixel driving circuit of a display panel according to some embodiments of the present disclosure.

Example embodiments will now be described more fully with reference to the accompanying drawings. Example embodiments may, however, be embodied in many forms and should not be construed as limited to the examples set forth here; on the contrary, these embodiments are provided so that the present disclosure will be thorough and complete, and will fully convey the concept of example embodiments to those skilled in the art. The same reference numbers in the drawings denote the same or similar structures, and thus their detailed descriptions will be omitted.

The terms "a", "an" and "the" are used to indicate the presence of one or more elements/components/etc.; The terms "including" and "comprising" are used to express the meaning of open inclusion and refer to the existence of other elements/components/etc. in addition to the listed elements/components/etc.

In related art, the structure of three gate layers of the display panel is relatively complicated and needs to be formed through more than one mask. The present disclosure provides a display panel, the structure of which is relatively simple. As shown in FIG. 1, it is a schematic structural diagram of a pixel driving circuit of a display panel according to some embodiments of the present disclosure. The pixel driving circuit may include a driving transistor T3, a first transistor T1, a second transistor T2, a fourth transistor T4, a fifth transistor T5, a sixth transistor T6, a seventh transistor T7, an eighth transistor T8, and a capacitor C. Among them, the first electrode of the fourth transistor T4 is connected to the data signal end Da, the second electrode is connected to the first electrode of the driving transistor T3, and the gate is connected to the second gate driving signal end G2; the first electrode of the fifth transistor T5 is connected to the first power end VDD, the second electrode is connected to the first electrode of the driving transistor T3, and the gate is connected to the enabling signal end EM; the gate of the driving transistor T3 is connected to the node N; the first electrode of the second transistor T2 is connected to the node N, the second electrode is connected to the second electrode of the driving transistor T3, and the gate is connected to the first gate driving signal end G1; the first electrode of the sixth transistor T6 is connected to the second electrode of the driving transistor T3, the second electrode is connected to the second electrode of the seventh transistor T7, the gate is connected to the enabling signal end EM, the first electrode of the seventh transistor T7 is connected to the second initial signal end Vinit2, and the gate is connected to the second reset signal end Re2; the second electrode of the first transistor T1 is connected to the node N, the first electrode is connected to the first initial signal end Vinit1, and the gate is connected to the first reset signal end Re1; the first electrode of the capacitor C is connected to the node N, the second electrode is connected to the first power end VDD, and the first electrode of the eighth transistor T8 is connected to the third initial signal line Vinit3, the second electrode is connected to the first electrode of the driving transistor, and the gate is connected to the second reset signal end Re2. The pixel driving circuit may be connected to a light emitting unit OLED for driving the light emitting unit OLED to emit light, and the light emitting unit OLED may be connected between the second electrode of the sixth transistor T6 and the second power end VSS. Among them, the first transistor T1 and the second transistor T2 may be N-type transistors; the driving transistor T3, the fourth transistor T4, the fifth transistor T5, the sixth transistor T6, the seventh transistor T7, and the eighth transistor T8 may be P-type transistors.

The method for driving the pixel driving circuit may include a reset stage, a data writing stage, and a light emitting stage. In the reset stage, the first reset signal end Re1 outputs a high-level signal, the second reset signal end Re2 outputs a low-level signal, the first transistor T1 and the eighth transistor T8 are turned on, the first initial signal end Vinit1 inputs a first initial signal to the node N, and the third initial signal end Vinit3 inputs a third initial signal to the first electrode of the driving transistor T3. In the data writing stage, the first gate driving signal end G1 outputs a high-level signal, the second gate driving signal end G2 outputs a low-level signal, the second transistor T2 and the fourth transistor T4 are turned on, and the data signal end Da outputs a data signal to write the compensation voltage Vdata+Vth to the node N, where Vdata is the voltage of the data signal, and Vth is the threshold voltage of the driving transistor T3. In the light emitting stage, the enabling signal end EM outputs a low-level signal, the sixth transistor T6 and the fifth transistor T5 are turned on, and the driving transistor T3 drives the light-emitting unit to emit light under the action of the compensation voltage Vdata+Vth stored in the capacitor C. The output current of the driving transistor in the pixel driving circuit of the present disclosure is I=($\mu$WCox/2L)(Vdata+Vth−Vdd−Vth)2. The pixel driving circuit can avoid the influence of the threshold value of the driving transistor on its output current. Among them, I is the output current of the driving transistor; u is the carrier mobility; Cox is the gate capacitance per unit area, W is the width of channel of the driving transistor, L is the length of channel of the driving transistor, Vgs is the gate-source voltage difference of the driving transistor, and Vth is the threshold voltage of the driving transistor.

Figure 2:
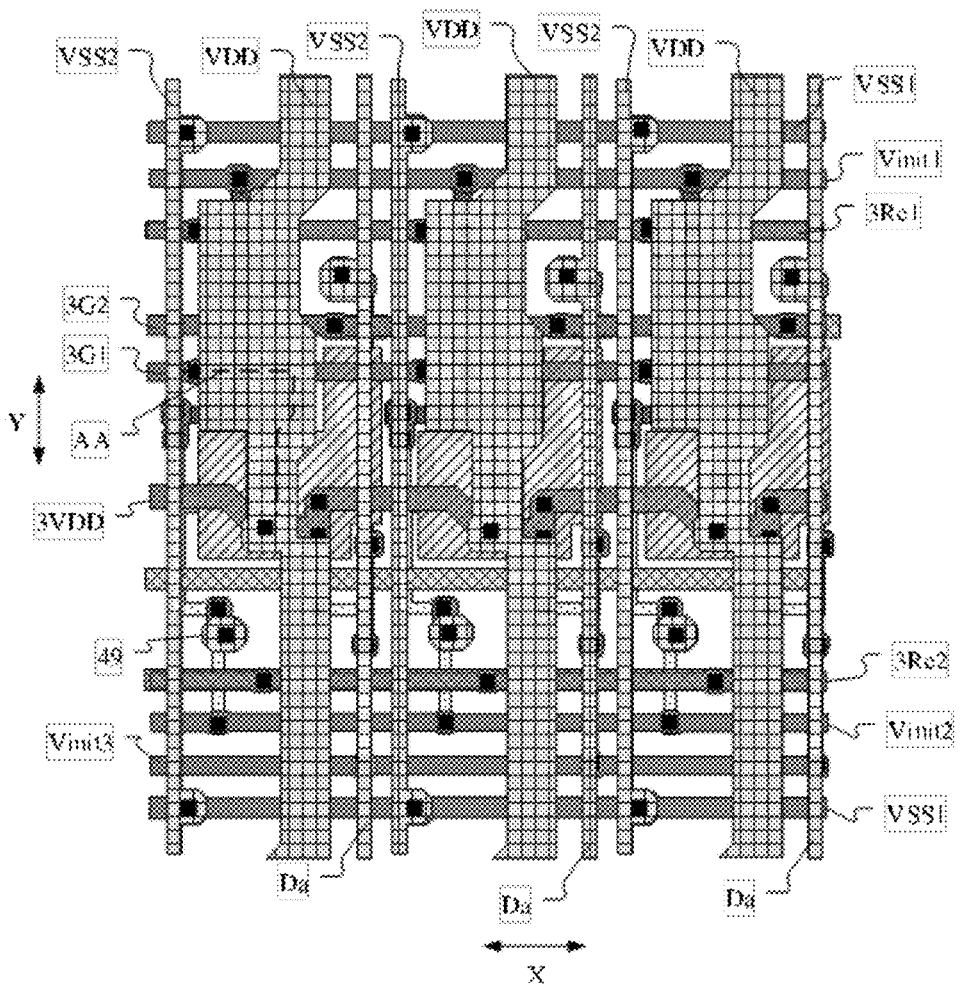
FIG. 2 is a structural layout of a display panel according to some embodiments of the present disclosure.
Figure 3:
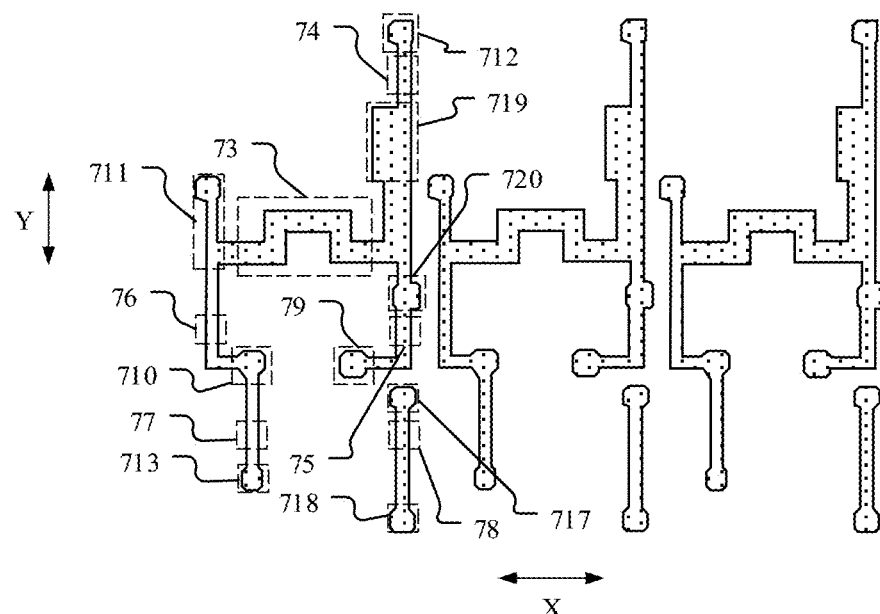
FIG. 3 is a structural layout of the first active layer in FIG. 2.
Figures 4, 5:
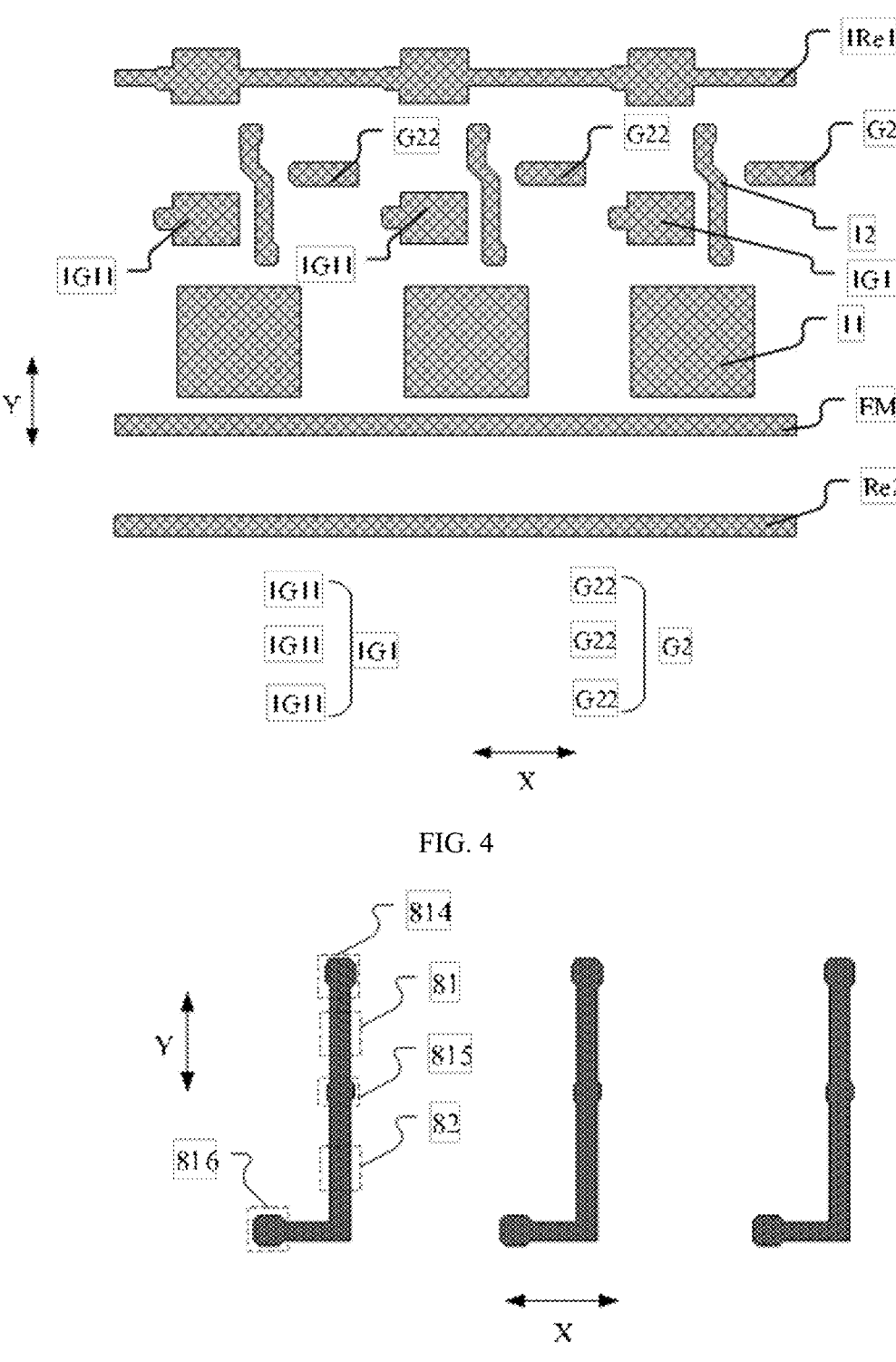
FIG. 4 is a structural layout of the first conductive layer in FIG. 2.
FIG. 5 is a structural layout of the second active layer in FIG. 2.
Figure 6:
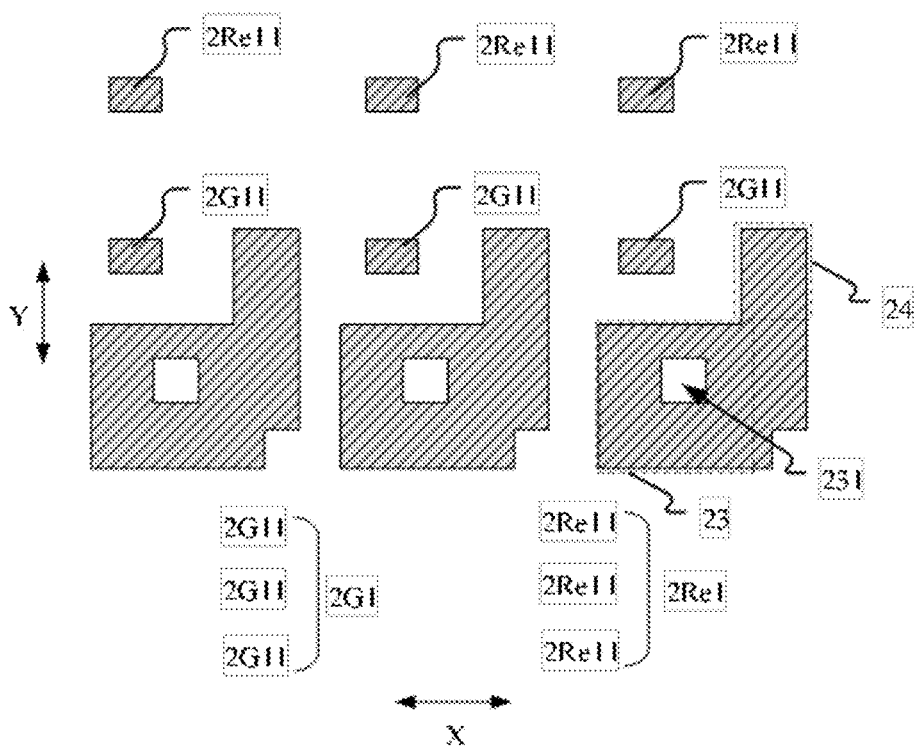
FIG. 6 is a structural layout of the second conductive layer in FIG. 2.
Figure 7:
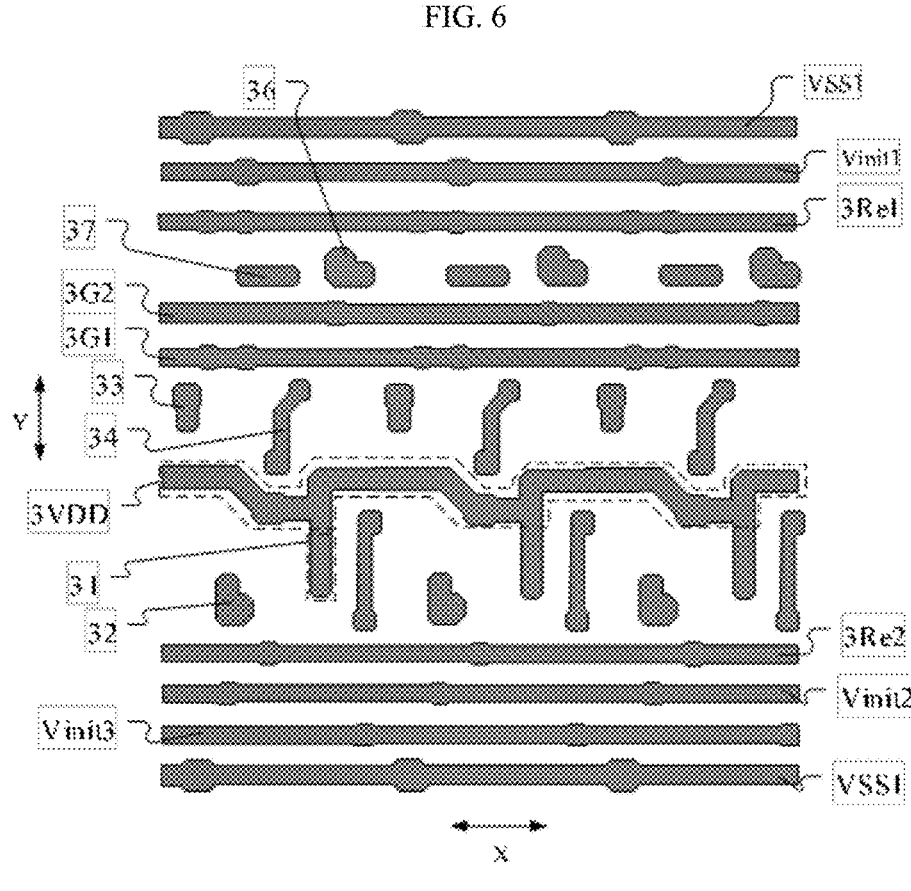
FIG. 7 is a structural layout of the third conductive layer in FIG. 2.
Figure 8:
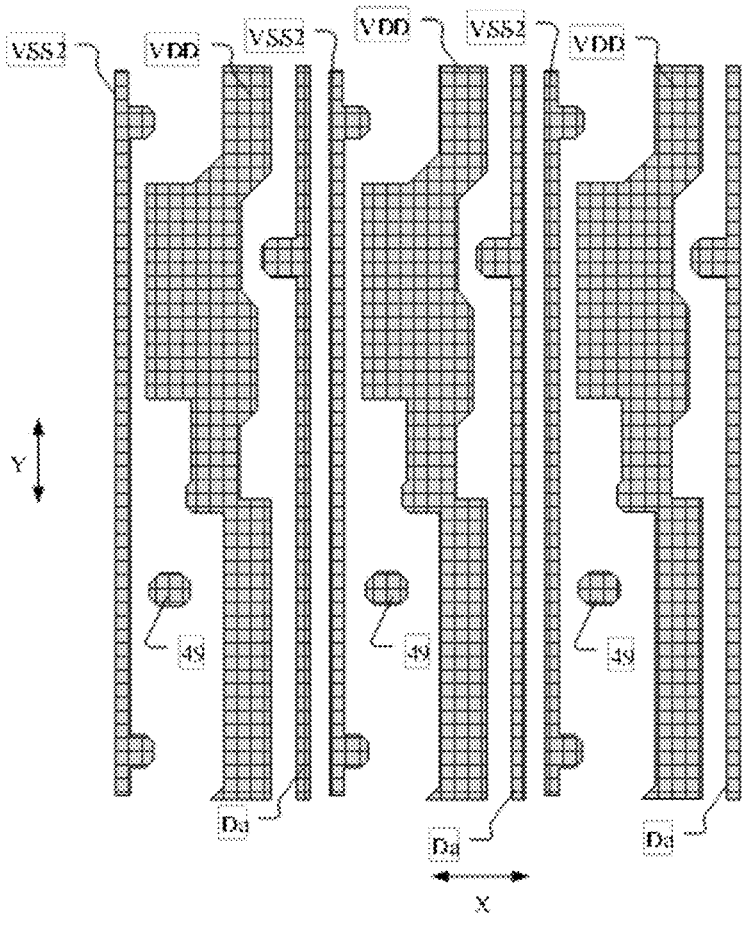
FIG. 8 is a structural layout of the fourth conductive layer in FIG. 2.
Figure 9:
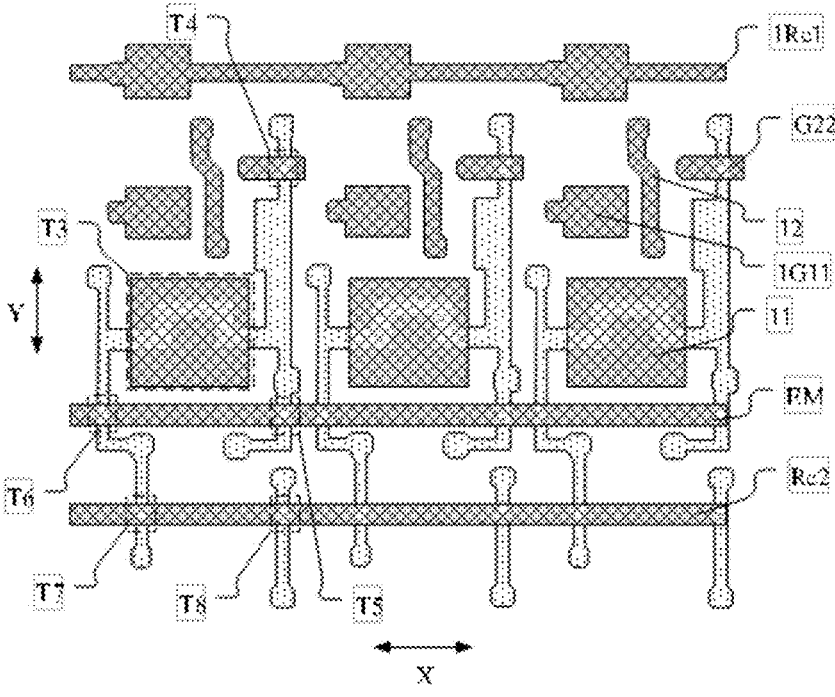
FIG. 9 is a structural layout of the first active layer and the first conductive layer in FIG. 2.
Figure 10:
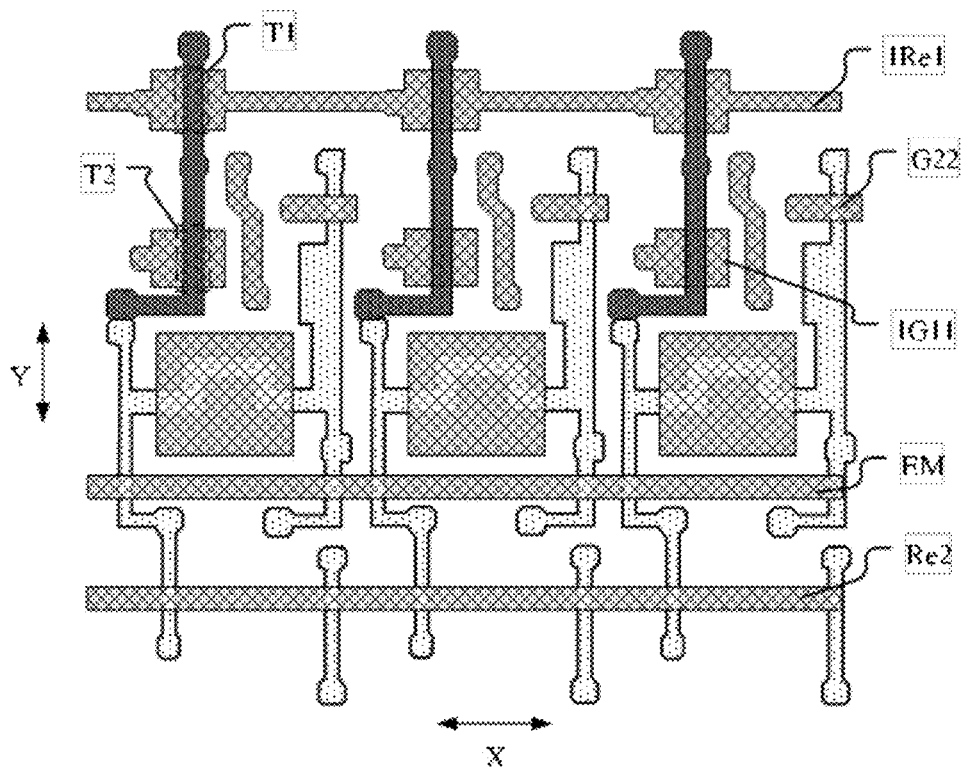
FIG. 10 is a structural layout of the first active layer, the first conductive layer, and the second active layer in FIG. 2.
Figure 11:
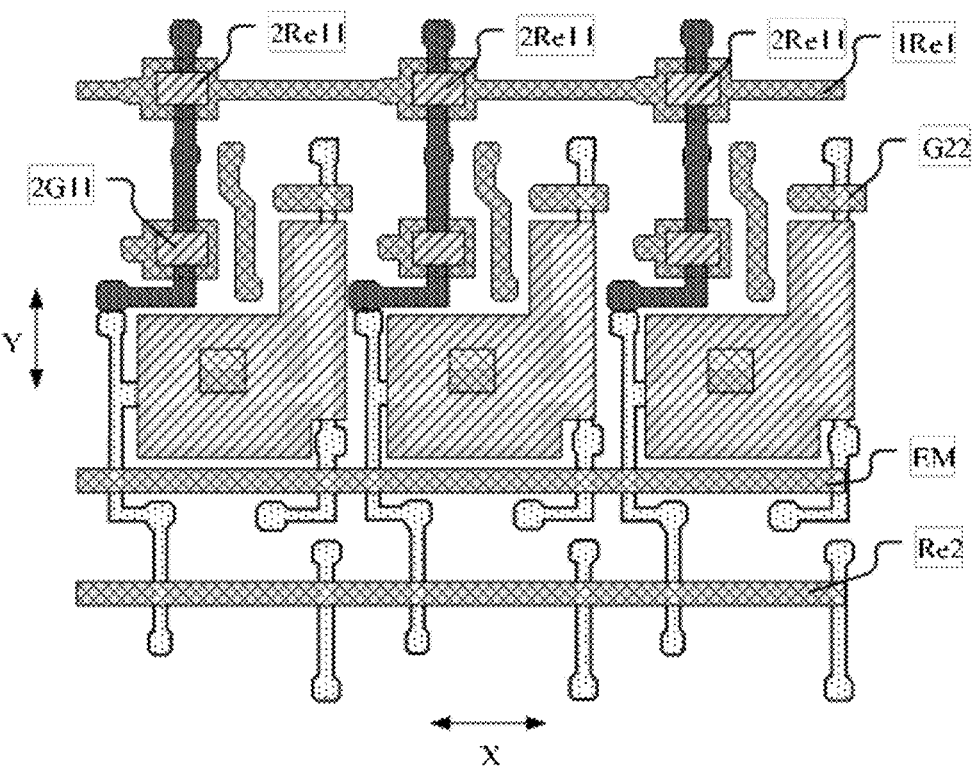
FIG. 11 is a structural layout of the first active layer, the first conductive layer, the second active layer, and the second conductive layer in FIG. 2.
Figure 12:
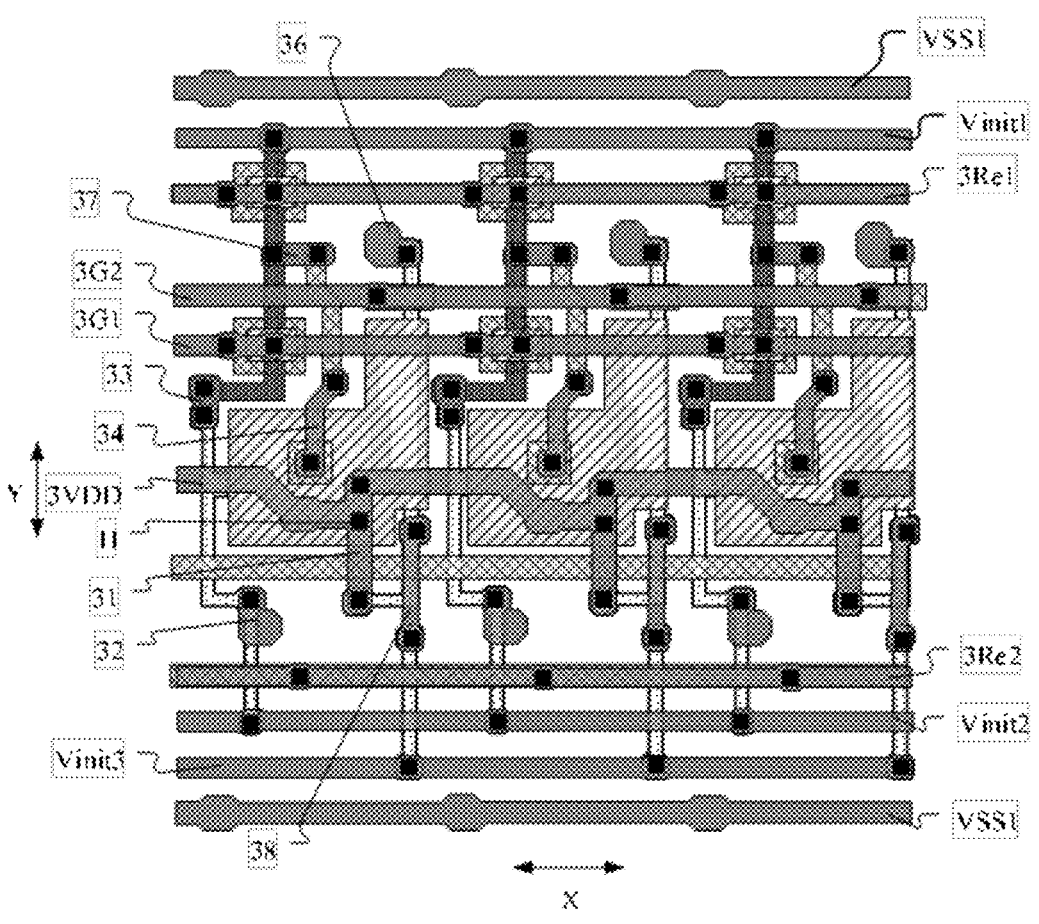
FIG. 12 is a structural layout of the first active layer, the first conductive layer, the second active layer, the second conductive layer, and the third conductive layer in FIG. 2.

Embodiments of the present disclosure also provide a display panel, which may include a base substrate, a first active layer, a first conductive layer, a second active layer, a second conductive layer, a third conductive layer and the fourth conductive layer that are stacked in sequence. Among them, an insulation layer may be provided between the above-mentioned adjacent layers. As shown in FIG. 2-FIG. 12, FIG. 2 is a structural layout of a display panel according to some embodiments of the present disclosure, FIG. 3 is a structural layout of the first active layer in FIG. 2, FIG. 4 is a structural layout of the first conductive layer in FIG. 2, FIG. 5 is the structural layout of the second active layer in FIG. 2, FIG. 6 is the structural layout of the second conductive layer in FIG. 2, FIG. 7 is the structural layout of the third conductive layer in FIG. 2, FIG. 8 is the structural layout of the fourth conductive layer in FIG. 2, FIG. 9 is the structural layout of the first active layer and the first conductive layer in FIG. 2, FIG. 10 is the structural layout of the first active layer, the first conductive layer, the second conductive layer in FIG. 2, FIG. 11 is the structural layout of the first active layer, the first conductive layer, the second active layer, and the second conductive layer in FIG. 2, and FIG. 12 is the structural layout of the first active layer, the first conductive layer, the second active layer, the second conductive layer, and the third conductive layer in FIG. 2. The display panel may include the pixel driving circuit shown in FIG. 1.

In some embodiments, the first active layer may be used to form a channel region of a first type transistor, and the second active layer may be used to form a channel region of a second type transistor. The first type transistor may be a P-type transistor, and the second type transistor may be an N type transistor. Compared with the related art, the display panel is not provided with a second gate layer, that is, partial structure of the first conductive layer can be used to form the gate of the first type transistor, and partial structure of the first conductive layer can be used to form the bottom gate of the second type transistor. This setting can reduce the number of masks in the process of manufacturing the display panel and simplify the structure of the display panel.

As shown in FIG. 2, FIG. 3, and FIG. 9, the first active layer may include a third active part 73, a fourth active part 74, a fifth active part 75, a sixth active part 76, a seventh active part. 77, and an eighth active part 78. Among them, the third active part 73 can be used to form the channel region of the driving transistor T3; the fourth active part 74 can be used to form the channel region of the fourth transistor T4; the fifth active part 75 can be used to form the channel region of the fourth transistor T5; the sixth active part 76 can be used to form the channel region of the sixth transistor T6; the seventh active part 77 can be used to form the channel region of the seventh transistor T7; the eighth active part 78 can be used to form the channel region of the eighth transistor T8. The first active layer further includes: the ninth active part 79, the tenth active part 710, the eleventh active part 711, the twelfth active part 712, the thirteenth active part 713, the seventeenth active part 717, the eighteenth active part 718, the nineteenth active part 719, and the twentieth active part 720. Among them, the ninth active part 79 is connected to an end of the fifth active part 75 away from the third active part 73. The tenth active part 710 is connected between the sixth active part 76 and the seventh active part 77, the eleventh active part 711 is connected between the sixth active part 76 and the third active part 73, the twelfth active part 712 is connected to an end of the fourth active part 74 away from the third active part 73, the thirteenth active part 713 is connected to an end of the seventh active part 77 away from the sixth active part 76, the seventeenth active part 717 and the eighteenth active part 718 are respectively connected to two ends of the eighth active part 78, and the nineteenth active part 719 is connected between the fourth active part 74 and the fifth active part 75. The size of the orthographic projection of the nineteenth active part 719 on the base substrate in the first direction X is larger than the size of the orthographic projection of the fourth active part 74 on the base substrate in the first direction X. The twentieth active part 720 is connected between the nineteenth active part 719 and the fifth active part 75. The first active layer can be formed of polysilicon material, and correspondingly, the driving transistor T3, the fourth transistor T4, the fifth transistor T5, the sixth transistor T6, the seventh transistor T7, and the eighth transistor T8 can be P-type low-temperature polysilicon thin film transistors.

As shown in FIG. 2, FIG. 4 and FIG. 9, the first conductive layer may include: a first conductive part 11, a second gate line G2, an enabling signal line EM, a second reset signal line Re2, a second conductive part 12, a first gate line 1G1 and a first reset signal line 1Re1. The second gate line G2 can be used to provide the second gate driving signal end in FIG. 1; the enabling signal line EM can be used to provide the enabling signal end in FIG. 1; the second reset signal line Re2 can be used to provide the second reset signal end in FIG. 1; the first gate line 1G1 is used to provide the first gate driving signal end in FIG. 1, and the first reset signal line 1Re1 is used to provide the first reset signal end in FIG. 1. The orthographic projection of the enabling signal line EM on the base substrate, the orthographic projection of the first reset signal line 1Re1 on the base substrate, the orthographic projection of the second reset signal line Re2 on the base substrate, the orthographic projection of the first gate line 1G1 on the base substrate and the orthographic projection of the second gate line G2 on the base substrate may all extend along the first direction X. In some embodiments, the orthographic projection of a structure on the base substrate extending along a certain direction, may be understood as that the orthographic projection of the structure on the base substrate extends in a straight line or extends being bent along the direction. The second gate line G2 may have more than one second gate line segment G22, and the orthographic projections of the more than one second gate line segment G22 in the same second gate line G2 on the base substrate extend along the first direction X and are distributed at intervals along the first direction X, the orthographic projection of the second gate line segment G22 on the base substrate covers the orthographic projection of the fourth active part 74 on the base substrate, and partial structure of the second gate line segment G22 is used to form the gate of the fourth transistor T4. The orthographic projection of the enabling signal line EM on the base substrate covers the orthographic projection of the fifth active part 75 on the base substrate and the orthographic projection of the sixth active part 76 on the base substrate, partial structure of the enabling signal line EM can be used to form the gate of the fifth transistor T5, and another partial structure of the enabling signal line EM can be used to form the gate of the sixth transistor T6. The orthographic projection of the second reset signal line Re2 on the base substrate can cover the orthographic projection of the seventh active part 77 on the base substrate and the orthographic projection of the eighth active part 78 on the base substrate. Partial structure of the second reset signal line Re2 can be used to form the gate of the seventh transistor T7, and another partial structure of the second reset signal line Re2 can be used to form the gate of the eighth transistor T8. The orthographic projection of the first conductive part 11 on the base substrate covers the orthographic projection of the third active part 73 on the base substrate, and the first conductive part 11 can be used to form the gate of the driving transistor T3 and the first electrode of the capacitor C. The first gate line 1G1 includes more than one first gate line segment 1G11, and orthographic projections of the more than one first gate line segment 1G11 in the same first gate line 1G1 are distributed at intervals along the first direction X and extend along the first direction X. In addition, the display panel can use the first conductive layer as a mask to perform conductorization treatment on the first active layer, that is, the region covered by the first conductive layer in the first active layer can form the channel region of the transistor, and the region of the active layer not covered by the first conductive layer forms a conductor structure.

As shown in FIG. 2, FIG. 5, and FIG. 10, the second active layer may include a first active part 81, a second active part 82, a fourteenth active part 814, a fifteenth active part 815, a sixteenth active part active part 816. The first active part 81 is used to form the channel region of the first transistor T1, and the second active part 82 is used to form the channel region of the second transistor T2. The fifteenth active part 815 is connected between the first active part 81 and the second active part 82. The fourteenth active part 814 is connected to an end of the first active part 81 away from the fifteenth active part 815, and the sixteenth active part 816 is connected to an end of the second active part 82 away from the first active part 81. Among them, the second active layer may be formed of indium gallium zinc oxide, and correspondingly, the first transistor T1 and the second transistor T2 may be N-type metal oxide thin film transistors. The orthographic projection of the first gate line 1G1 on the base substrate may cover the orthographic projection of the second active part 82 on the base substrate, and partial structure of the first gate line 1G1 may be used to form the bottom gate of the second transistor. The orthographic projection of the first reset signal line 1Re1 on the base substrate can cover the orthographic projection of the first active part 81 on the base substrate, and partial structure of the first reset signal line 1Re1 can be used to form the bottom gate of the first transistor T1.

As shown in FIG. 2, FIG. 6 and FIG. 11, the second conductive layer may include: a third reset signal line 2Re1, a third gate line 2G1, a third conductive part 23, and a fourth conductive part 24. Among them, the third reset signal line 2Re1 can be used to provide the first reset signal end in FIG. 1, and the third gate line 2G1 can be used to provide the first gate driving signal end in FIG. 1. The third reset signal line 2Re1 may include more than one third reset signal line segment 2Re11, and the orthographic projections of the more than one third reset signal line segment 2Re11 in the same third reset signal line 2Re1 on the base substrate are distributed at intervals along the first direction X and extend along the first direction X, the orthographic projection of the third reset signal line segment 2Re11 on the base substrate can cover the orthographic projection of the first active part 71 on the base substrate, and partial structure of the third reset signal line segment 2Re11 can be used to form the top gate of the first transistor T1. The third gate line 2G1 may include more than one third gate line segment 2G11, and the orthographic projections of the more than one third gate line segment 2G11 in the same third gate line 2G1 on the base substrate are distributed at intervals along the first direction X and extend along the first direction X, the orthographic projection of the third gate line segment 2G11 on the base substrate can cover the orthographic projection of the second active part 72 on the base substrate, and partial structure of the third gate line segment 2G11 can be used to form the top gate of the second transistor T2. The orthographic projection of the third conductive part 23 on the base substrate at least partially overlaps with the orthographic projection of the first conductive part 11 on the base substrate, and the third conductive part 23 is used to form the second electrode of the capacitor C. The fourth conductive part 24 is connected to the third conductive part 23, the orthographic projection of the fourth conductive part 24 on the base substrate may at least partially overlap with the orthographic projection of the nineteenth active part 719 on the base substrate, and the orthographic projection of the fourth conductive part 24 on the base substrate may be located between the orthographic projections of the third gate line segments 2G11 adjacent in the first direction X on the base substrate. The fourth conductive part 24 and the nineteenth active part 719 can form a parasitic capacitance. In the data writing stage, the data signal input to the second electrode of the fourth transistor T4 can be stored in the parasitic capacitance. When the data writing stage ends, the data signal stored in the parasitic capacitance can continue to input a compensation voltage to the node N through the driving transistor T3. This setting can fully write the compensation voltage to the node N in a short data writing stage, so that a higher refresh frequency of the display panel can be realized. It should be understood that, in some embodiments, more than one third conductive part 23 distributed in the first direction X may be connected to each other. In addition, the display panel can use the second conductive layer as a mask to perform conductorization treatment on the second active layer, that is, the region covered by the second conductive layer in the second active layer can form the channel region of the transistor, and the regions not covered by the second conductive layer in the second active layer form a conductor structure.

As shown in FIG. 2, FIG. 7, and FIG. 12, the third conductive layer may include a first bridging part 31, a second bridging part 32, a third bridging part 33, a fourth bridging part 34, a sixth bridging part 36, a seventh bridging part 37, an eighth bridging part 38, a first initial signal line Vinit1, a second initial signal line Vinit2, a third initial signal line Vinit3, a first power line VSS1, a first gate connection line 3G1, a second gate connection line 3G2, a first reset connection line 3Re1, a second reset connection line 3Re2, and a power connection line 3VDD. The orthographic projection of the first initial signal line Vinit1 on the base substrate, the orthographic projection of the second initial signal line Vinit2 on the base substrate, the orthographic projection of the third initial signal line Vinit3 on the base substrate, the orthographic projection of the first power line VSS1 on the base substrate, the orthographic projection of the first gate connection line 3G1 on the base substrate, the orthographic projection of the second gate connection line 3G2 on the base substrate, the orthographic projection the first reset connection line 3Re1 on the base substrate, the orthographic projection of the second reset connection line 3Re2 on the base substrate, and the orthographic projection of the power connection line 3VDD on the base substrate can all extend along the first direction X. The orthographic projection of the second conductive part 12 on the base substrate intersects with the orthographic projection of the first gate connection line 3G1 on the base substrate. The first initial signal line Vinit1 is used to provide a first initial signal end, the second initial signal line Vinit2 is used to provide a second initial signal end, and the third initial signal line Vinit3 is used to provide a third initial signal end. The first bridging parts 31 located in the same pixel row may be connected to the same power connection line 3VDD. The power connection line 3VDD can be connected to more than one third conductive part 23 in the same pixel row respectively through the via holes H, and the black blocks indicate the positions of the via holes. The first bridging part 31 can be connected to the ninth active part 79 through a via hole, so as to connect the first electrode of the fifth transistor and the second electrode of the capacitor C. The second bridging part 32 may be connected to the tenth active part 710 through a via hole, so as to connect the second electrode of the sixth transistor T6 and the second electrode of the seventh transistor T7. The third bridging part 33 can be connected to the eleventh active part 711 and the sixteenth active part 816 respectively through via holes to connect the second electrode of the second transistor T2, the first electrode of the sixth transistor T6, and the second electrode of the driving transistor T3. The fourth bridging part 34 can be connected to the second conductive part 12 and the first conductive part 11 respectively through via holes, and the seventh bridging part 37 can be connected to the second conductive part 12 and the fifteenth active part 815 respectively through via holes to connect the first electrode of the second transistor T2 and the gate of the driving transistor. As shown in FIG. 6 and FIG. 12, an opening 231 is formed on the third conductive part 23, and the orthographic projection of the via hole connected between the first conductive part 11 and the fourth bridging part 34 on the base substrate is located within the orthographic projection of the opening 231 on the base substrate, so that the conductive structure in the via hole and the third conductive part 23 are insulated from each other. The eighth bridging part 38 may be connected to the seventeenth active part 717 and the twentieth active part 720 respectively through via holes, so as to connect the second electrode of the eighth transistor and the first electrode of the driving transistor. The first initial signal line Vinit1 can be connected to the fourteenth active part 814 through a via hole, so as to connect the first initial signal end and the first electrode of the first transistor T1. The second initial signal line Vinit2 can be connected to the thirteenth active part 713 through a via hole, so as to connect the second initial signal end and the first electrode of the seventh transistor. The third initial signal line Vinit3 is connected to the eighteenth active part 718 through a via hole, so as to connect the first electrode of the eighth transistor and the third initial signal end. The first gate connection line 3G1 can be connected to the third gate line segments 2G11 located in the same third gate line 2G1 respectively through via holes, and connected to the first gate line segments 1G11 located in the same first gate line 1G1 through via holes. The second gate connection line 3G2 can be connected to the second gate line segments G22 located in the same second gate line G2 respectively through via holes. The first reset connection line 3Re1 can be connected to the first reset signal line segments 1Re1l located in the same first reset signal line 1Re1 respectively through via holes, and connected to the third reset signal line segments 2Re11 located in the same third reset signal line 2Re1 respectively through via holes. The second reset connection line 3Re2 may be connected to the second reset signal line Re2 through more than one via hole. In some embodiments, the sheet resistance of the third conductive layer may be smaller than the sheet resistances of the first conductive layer and the second conductive layer. The first gate connection line 3G1 can reduce the self-resistance of the gate line connected to the second transistor T2, thereby improving the response speed of the second transistor T2. The second gate connection line 3G2 can reduce the self-resistance of the gate line connected to the fourth transistor T4, thereby improving the response speed of the fourth transistor T4. The first reset connection line 3Re1 can reduce the self-resistance of the gate line connected to the first transistor T1, thereby improving the response speed of the first transistor T1. The second reset connection line 3Re2 can reduce the self-resistance of the gate line connected to the seventh transistor and the eighth transistor, thereby improving the response speed of the seventh transistor and the eighth transistor.

As shown in FIG. 2 and FIG. 8, the fourth conductive layer may include more than one third power line VDD, more than one data line Da, a second power line VSS2, and a ninth bridging part 49. Among them, the orthographic projection of the third power line VDD on the base substrate, the orthographic projection of the data line Da on the base substrate, and the orthographic projection of the second power line VSS2 on the base substrate can all extend along the second direction Y. The second direction Y intersects with the first direction X, for example, the second direction Y may be a column direction, and the first direction X may be a row direction. The third power line VDD can be used to provide the first power end, the data line Da can be used to provide the data signal end, and the second power line VSS2 can be used to provide the second power end. As shown in FIG. 2 and FIG. 8, one third power line VDD can be provided corresponding to each column of pixel driving circuits, and the third power line VDD can be connected to the power connection line 3VDD through a via hole, so as to connect the first electrode of the fifth transistor and the first power end. The third power line VDD and the power connection line 3VDD can form a grid structure to reduce the voltage difference between the first power ends at different positions of the display panel, thereby improving the display uniformity of the display panel. The data line Da can be connected to the sixth bridging part 36 through a via hole, so as to connect the first electrode of the fourth transistor and the data signal end. The ninth bridging part 49 may be connected to the second bridging part 32 through a via hole, so as to be connected to the second electrode of the seventh transistor. The second power line VSS2 can be connected to the first power line VSS1 that intersects with it through a via hole to form a grid structure, the first power line VSS1 and the second power line VSS2 can be connected to the common electrode layer in the display panel, the common electrode layer is used to form the second electrode of the light emitting unit, and the first power line VSS1 and the second power line VSS2 forming the grid structure can reduce the voltage difference between different positions on the common electrode layer. The orthographic projection of the third power line VDD on the base substrate can cover the orthographic projection of the first active part 81 on the base substrate and the orthographic projection of the second active part 82 on the base substrate. The third power line VDD can reduce the influence of light on the characteristics of the first transistor T1 and the second transistor T2. In addition, the orthographic projection of the third power line VDD on the base substrate can cover the orthographic projection of the fourth bridging part 34 on the base substrate, and the third power line VDD can be used to shield the noise interference of other signals to the fourth bridging part 34, thereby improving the stability of the gate voltage of the driving transistor T3.

It should be understood that, in some embodiments, the first initial signal line Vinit1, the second initial signal line Vinit2, the third initial signal line Vinit3, and the first power line VSS1 may also be located in other conductive layers; or, the first initial signal line Vinit1, the second initial signal line Vinit2, the third initial signal line Vinit3, and the first power line VSS1 may be formed by connection of more than one conductive layer in parallel. For example, the first initial signal line Vinit1, the second initial signal line Vinit2, the third initial signal line Vinit3, and the first power line VSS1 can also be located in any one or more of the first active layer, the first conductive layer, the second conductive layer, and the second active layer.

Figure 13:
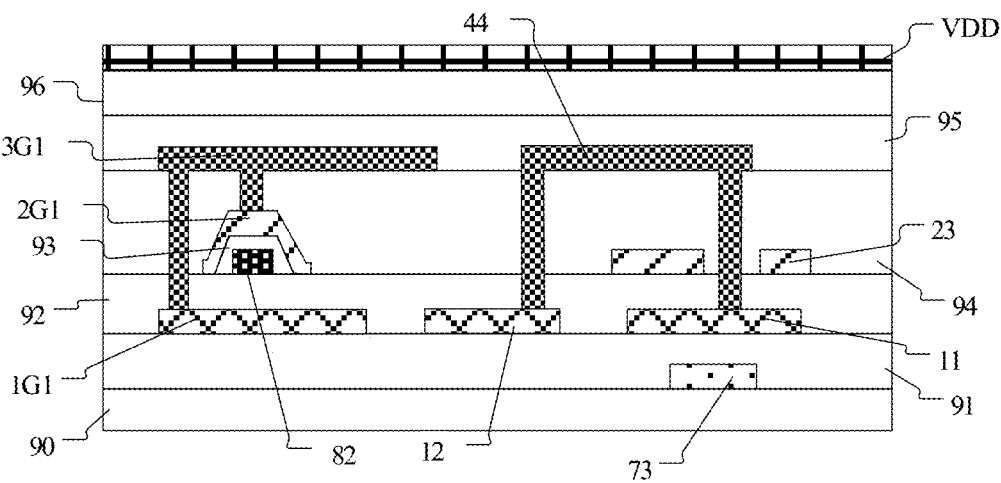
FIG. 13 is a partial cross-sectional view of the display panel shown in FIG. 2 taken along the dotted line AA.

As shown in FIG. 13, it is a partial cross-sectional view of the display panel shown in FIG. 2 taken along the dotted line AA. The display panel may further include a first insulation layer 91, a buffer layer 92, a second insulation layer 93, a dielectric layer 94, a passivation layer 95, and a flat layer 96. Among them, the base substrate 90, the first active layer, the first insulation layer 91, the first conductive layer, the buffer layer 92, the second active layer, the second insulation layer 93, the second conductive layer, the dielectric layer 94, the third conductive layer, the passivation layer 95, the flat layer 96, and the fourth conductive layer are stacked in sequence. The thickness of the buffer layer 92 may be larger than that of the second insulation layer 93. The first insulation layer 91 and the second insulation layer 93 can be of a single-layer structure or a multi-layer structure, and the materials of the first insulation layer 91 and the second insulation layer 93 can be at least one of silicon nitride, silicon oxide, and silicon oxynitride; the buffer layer 92 may include at least one of a silicon oxide layer and a silicon nitride layer. In some embodiments, the buffer layer may include a silicon oxide layer and a silicon nitride layer, and the silicon nitride layer is located between the first conductive layer and the silicon oxide layer. The capacity of the capacitor can be increased by thinning the buffer layer. For example, the thickness of the silicon oxide layer can be 700 angstroms-3000 angstroms, and the thickness of the silicon oxide layer can be 700 angstroms, 1500 angstroms, 2500 angstroms, 3000 angstroms, etc.; correspondingly, the thickness of the silicon nitride layer can be 700 angstroms-2000 angstroms, and the thickness of the silicon nitride layer can be 700 angstroms, 1500 angstroms, 2000 angstroms, etc. For another example, the thickness of the silicon oxide layer can be 700 angstroms-1500 angstroms, and the thickness of the silicon oxide layer can be 700 angstroms, 1100 angstroms, 1500 angstroms, etc.; correspondingly, the thickness of the silicon nitride layer can be 700 angstroms-1000 angstroms, and the thickness of the silicon nitride layer may be 700 angstroms, 900 angstroms, 1000 angstroms, etc. In addition, the capacity of the capacitor can also be improved by removing the silicon oxide layer between the two electrode plates of the capacitor. The dielectric layer 94 can be a silicon nitride layer; the passivation layer 95 can be a silicon oxide layer; the material of the flat layer 96 can be an organic material, such as polyimide (PI), polyethylene terephthalate (PET), polyethylene naphthalate (PEN), silicon-glass bonded structure (SOG), etc. The base substrate 90 may include a glass substrate, a barrier layer, and a polyimide layer stacked in sequence, and the barrier layer may be of an inorganic material. The material of the first conductive layer and the second conductive layer may be one or an alloy of molybdenum, aluminum, copper, titanium, niobium, or a molybdenum/titanium alloy or laminate, etc. The materials of the third conductive layer and the fourth conductive layer may include metal materials, such as one or an alloy of molybdenum, aluminum, copper, titanium, niobium, or a molybdenum/titanium alloy or laminate, etc., or titanium/aluminum/titanium laminate. The display panel may further include an electrode layer located on the side of the fourth conductive layer away from the base substrate, a pixel defining layer located on the side of the electrode layer away from the base substrate, and a light emitting material layer located on the side of the pixel defining layer away from the base substrate. The common electrode layer is located on the side of the light emitting material layer away from the base substrate.

In some embodiments, the display panel may further include a fan-out region, and the first conductive layer may include a first data fan-out line located in the fan-out region, the first data fan-out line is connected to the corresponding data line. The second conductive layer may further include a second data fan-out line located in the fan-out region, and the second data fan-out line is connected to the corresponding data line. In the present disclosure, the data fan-out lines in the fan-out region are provided in the first conductive layer and the second conductive layer at the same time. On the one hand, the integration degree of the data fan-out lines can be improved; on the other hand, since the distance between the first conductive layer and the second conductive layer in the present disclosure is relatively larger, this arrangement can reduce the signal crosstalk between the data fan-out lines.

In some embodiments, the second insulation layer 93 may be a patterned structure, for example, the second insulation layer 93 may only be located between the second active layer and the second conductive layer. The second insulation layer 93 may not be provided between the third conductive part 23 and the first conductive part 11, which can reduce the distance between the third conductive part 23 and the first conductive part 11, thereby increasing the capacity of the capacitor C. It should be understood that, in some embodiments, the thickness of local second insulation layer 93 and/or buffer layer 92 between the third conductive part 23 and the first conductive part 11 can also be reduced to reduce the distance between the third conductive part 23 and the first conductive part 11. For example, the distance between the third conductive part 23 and the first conductive part 11 in the thickness direction of the display panel may be smaller than the distance between the third gate line 2G1 and the first gate line 1G1 in the thickness direction of the display panel. Similarly, in some embodiments, the thickness of at least one of local first insulation layer 91, buffer layer 92 and second insulation layer 93 between the fourth conductive part 24 and the nineteenth active part 719 can also be reduced, so as to reduce the distance between the fourth conductive part 24 and the nineteenth active part 719, thereby increasing the capacity of the capacitor formed by the fourth conductive part 24 and the nineteenth active part 719. For example, the distance between the fourth conductive part 24 and the nineteenth active part 719 in the thickness direction of the display panel is smaller than the distance between the fourth conductive part 24 and the third active part 73 in the thickness direction of the display panel, where the thickness direction of the display panel is perpendicular to the base substrate.

Figure 14:
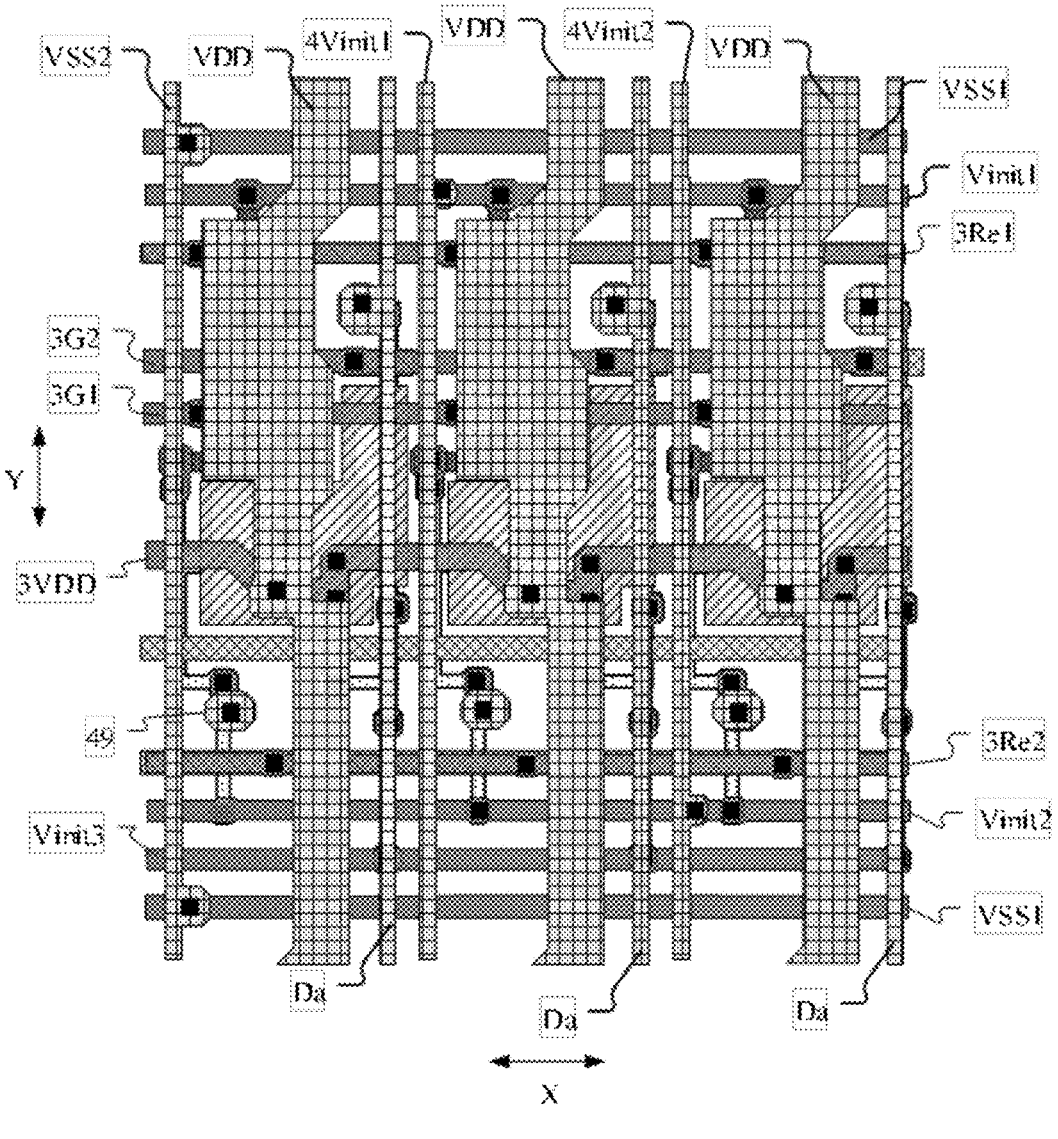
FIG. 14 is a schematic structural diagram of a display panel according to some embodiments of the present disclosure.
Figure 15:
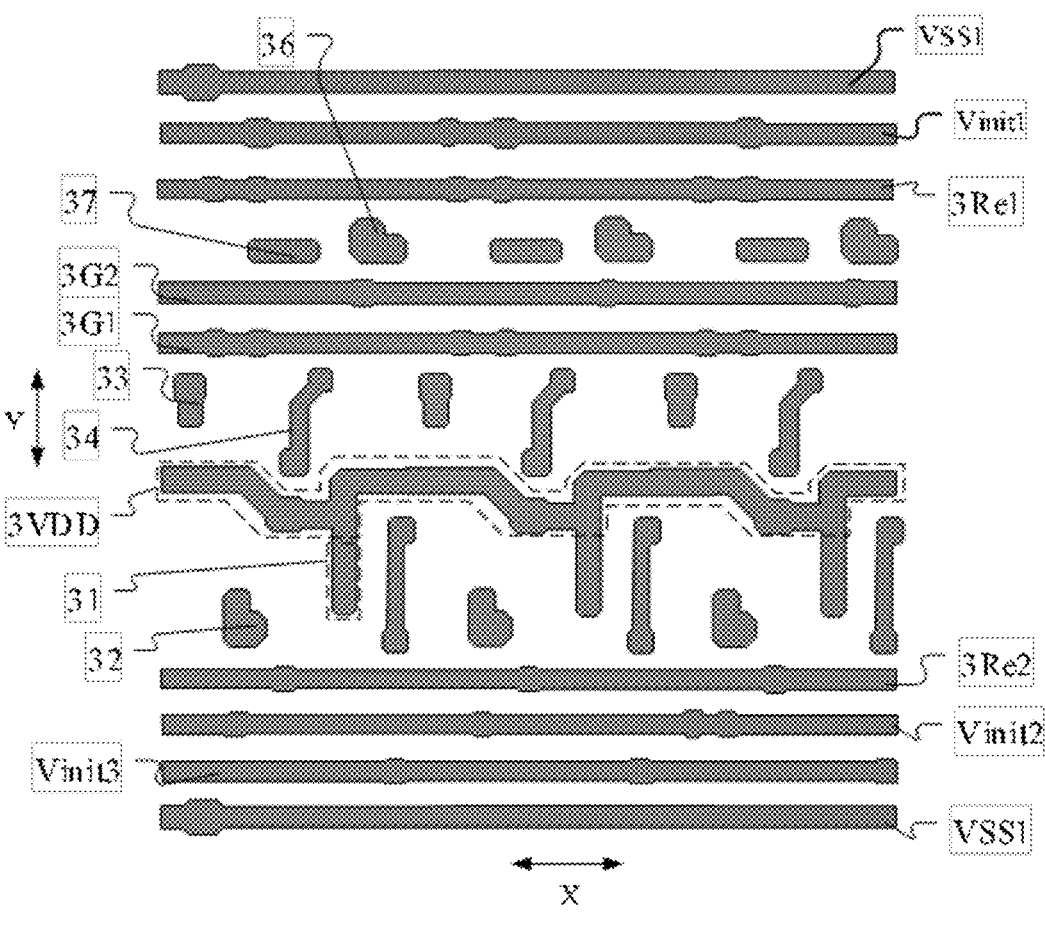
FIG. 15 is a structural layout of the third conductive layer in FIG. 14.
Figure 16:
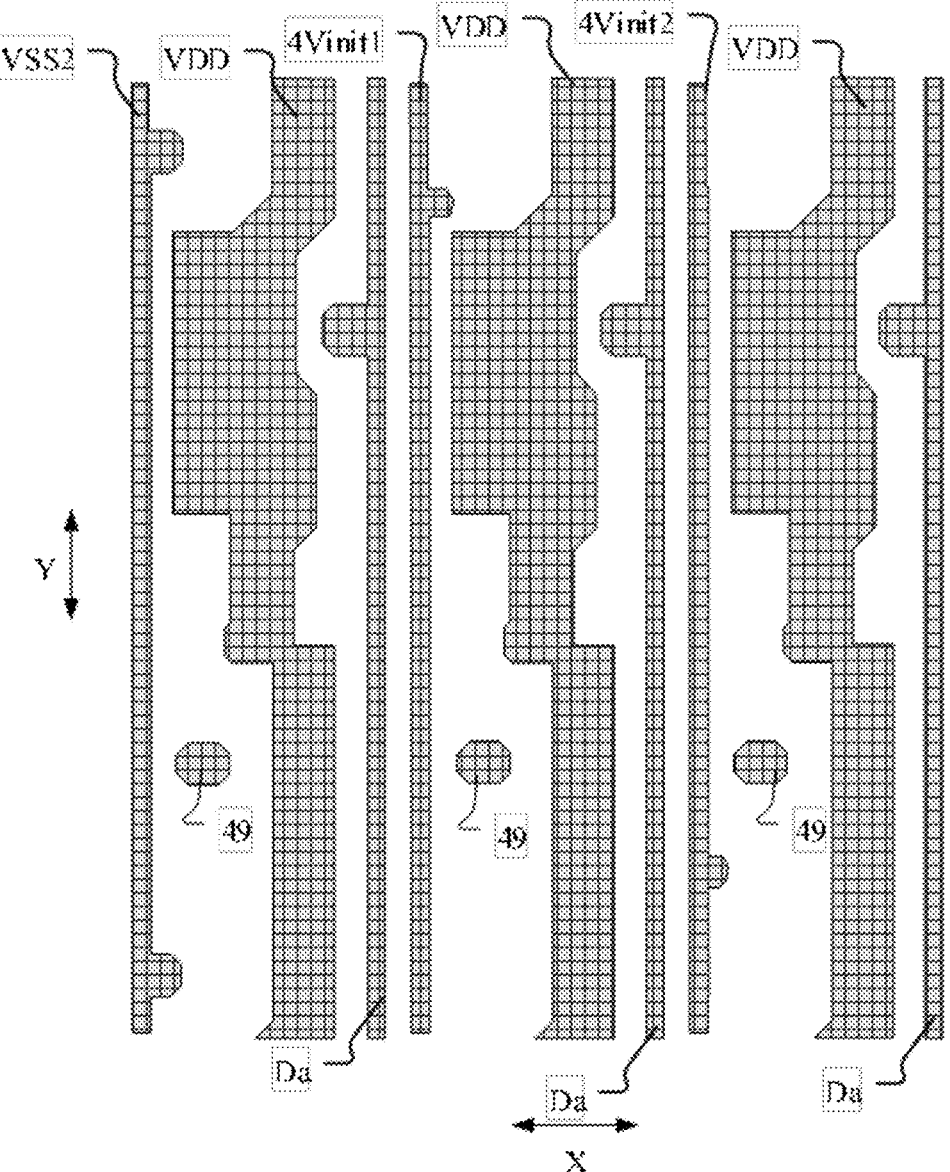
FIG. 16 is a structural layout of the fourth conductive layer in FIG. 14.
Figure 17:
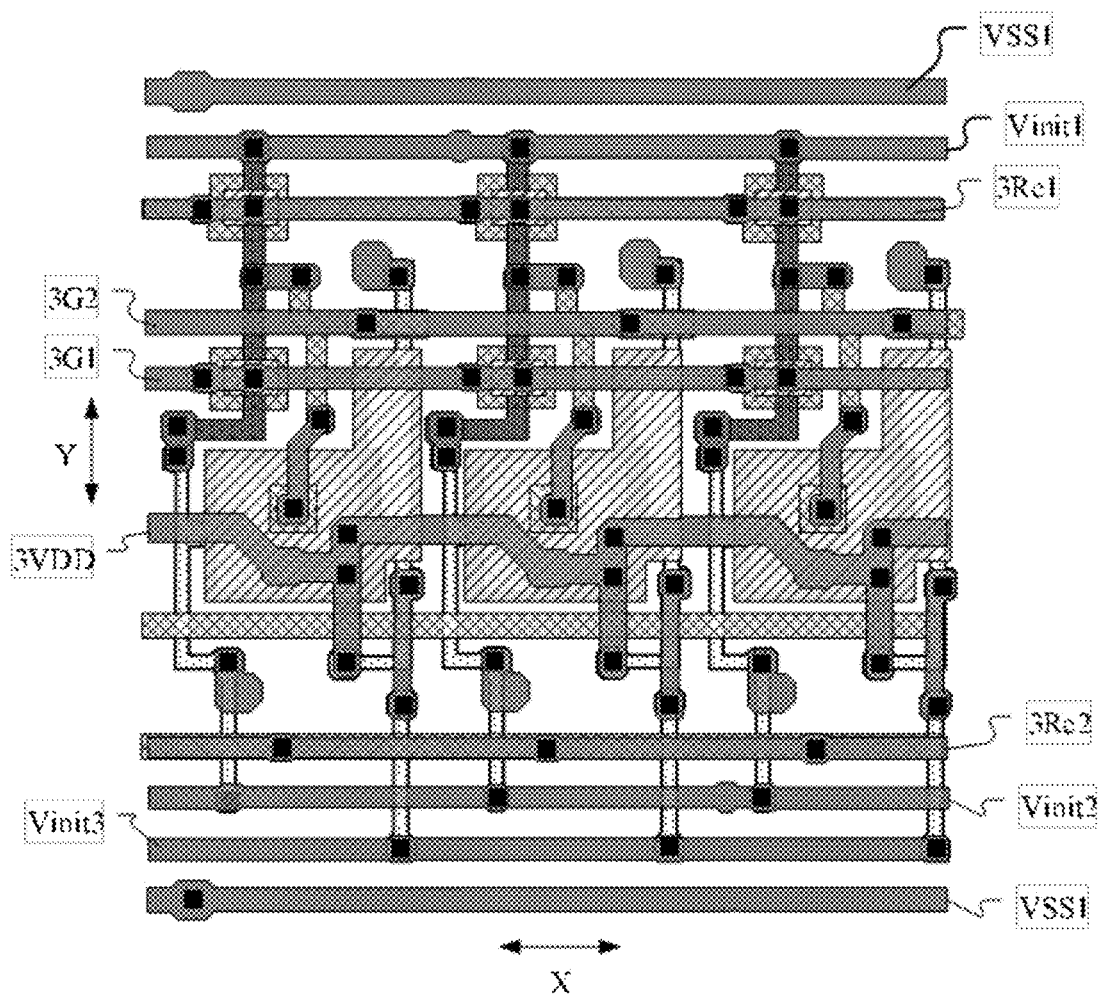
FIG. 17 is a structural layout of the first active layer, the first conductive layer, the second active layer, the second conductive layer, and the third conductive layer in FIG. 14.

As shown in FIG. 14-FIG. 17, FIG. 14 is a schematic structural diagram of the display panel according to some embodiments of the present disclosure. FIG. 15 is a structural layout of the third conductive layer in FIG. 14, and FIG. 16 is a structural layout of the fourth conductive layer in FIG. 14. FIG. 17 is a structural layout of the first active layer, the first conductive layer, the second active layer, the second conductive layer, and the third conductive layer in FIG. 14.

The difference between the display panel shown in FIG. 14 and the display panel shown in FIG. 2 is that the fourth conductive layer in the display panel shown in FIG. 14 further includes a fourth initial signal line 4Vinit1 and a fifth initial signal line 4Vinit2. The orthographic projections of the fourth initial signal line 4Vinit1 and the fifth initial signal line 4Vinit2 on the base substrate both extend along the second direction Y. The fourth initial signal line 4Vinit1 can be connected to the first initial signal line Vinit1 that intersects with its the orthographic projection on the base substrate through a via hole, and the fourth initial signal line 4Vinit1 and the first initial signal line Vinit1 form a grid structure, thereby reducing the voltage difference between the first initial signal ends in the pixel driving circuits at different positions of the display panel. The fifth initial signal line 4Vinit2 can be connected to the second initial signal line Vinit2 that intersects with its orthographic projection on the base substrate through a via hole, and the fifth initial signal line 4Vinit2 and the second initial signal line Vinit2 form a grid structure, thereby reducing the voltage difference between the second initial signal ends in the pixel driving circuits at different positions of the display panel. In some embodiments, as shown in FIG. 14, one second power line VSS2, one fourth initial signal line 4Vinit1, and one fifth initial signal line 4Vinit2 may be provided corresponding to every three adjacent columns of pixel driving circuits.

It should be understood that, in some embodiments, the fourth conductive layer may further include a sixth initial line, and the sixth initial line may be connected to the third initial signal line that intersects with it through a via hole, so as to reduce the voltage difference between the third initial signal ends in the pixel driving circuits at different positions of the display panel.

Figure 18:
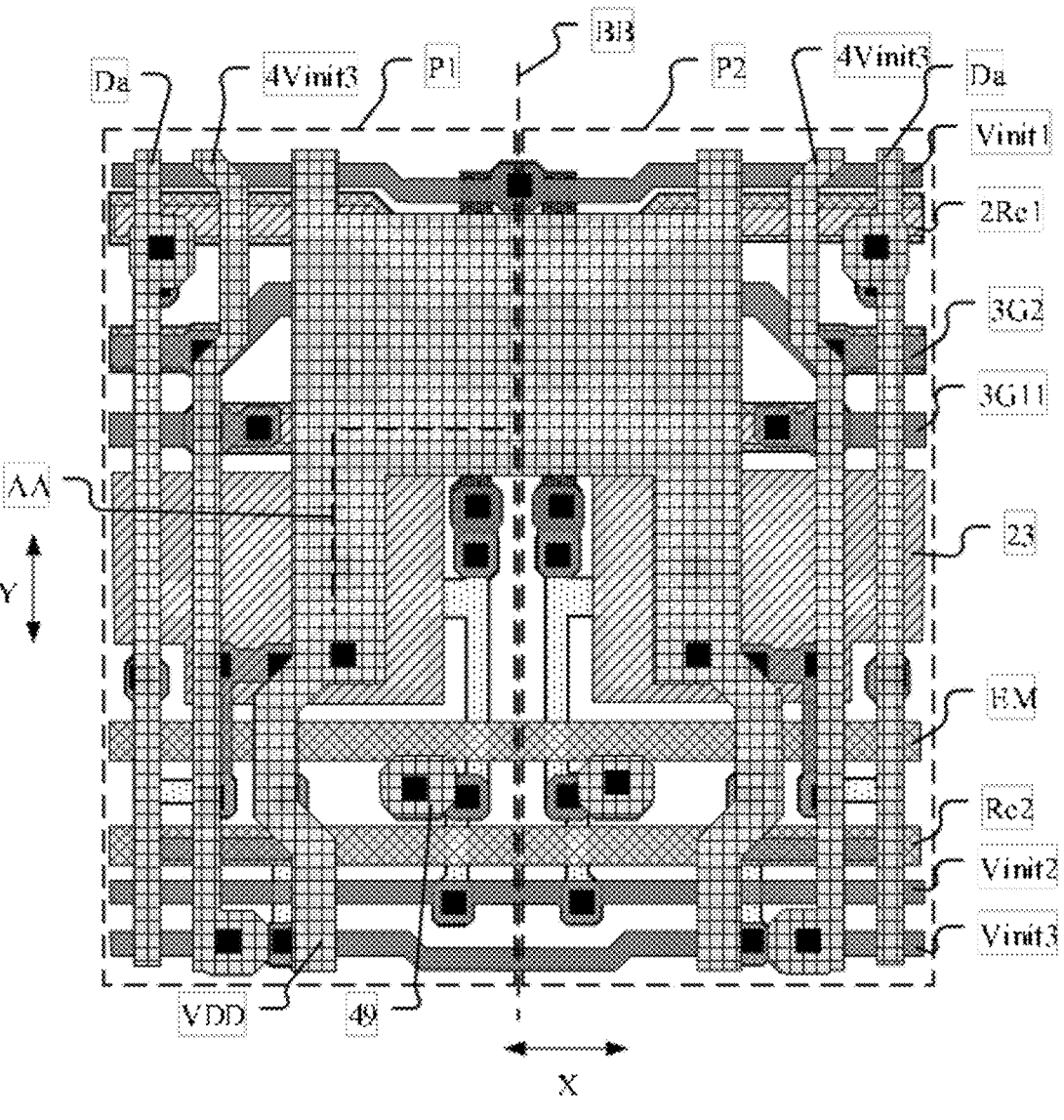
FIG. 18 is a structural layout of a display panel according to some embodiments of the present disclosure.
Figure 19:
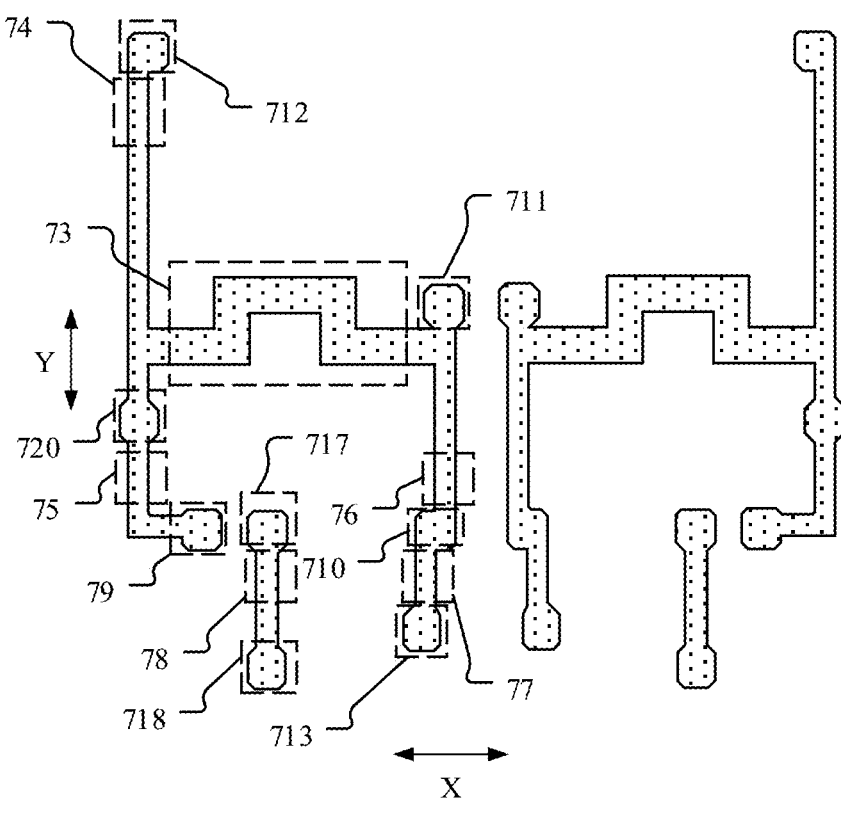
FIG. 19 is a structural layout of the first active layer in FIG. 18.
Figure 20:
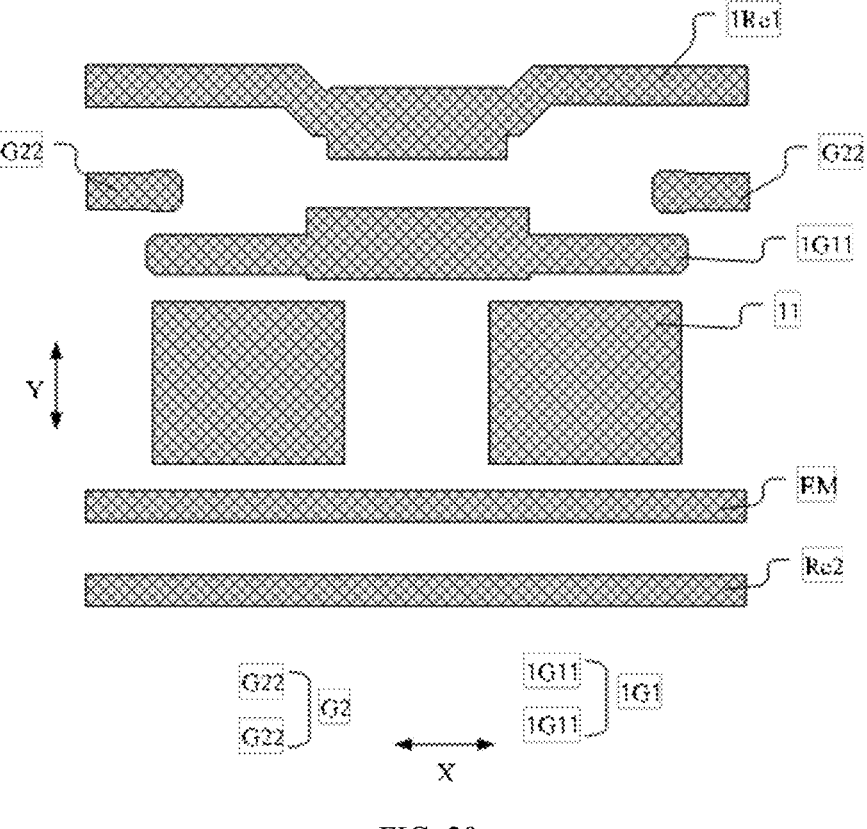
FIG. 20 is a structural layout of the first conductive layer in FIG. 18.
Figure 21:
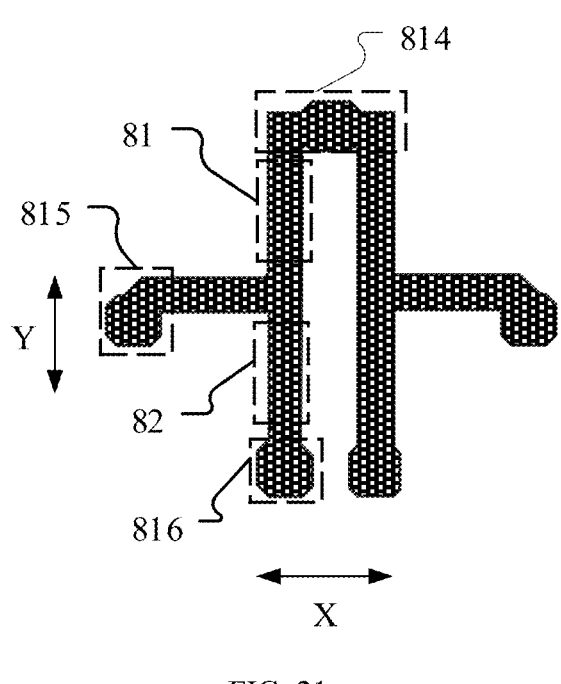
FIG. 21 is a structural layout of the second active layer in FIG. 18.
Figure 22:
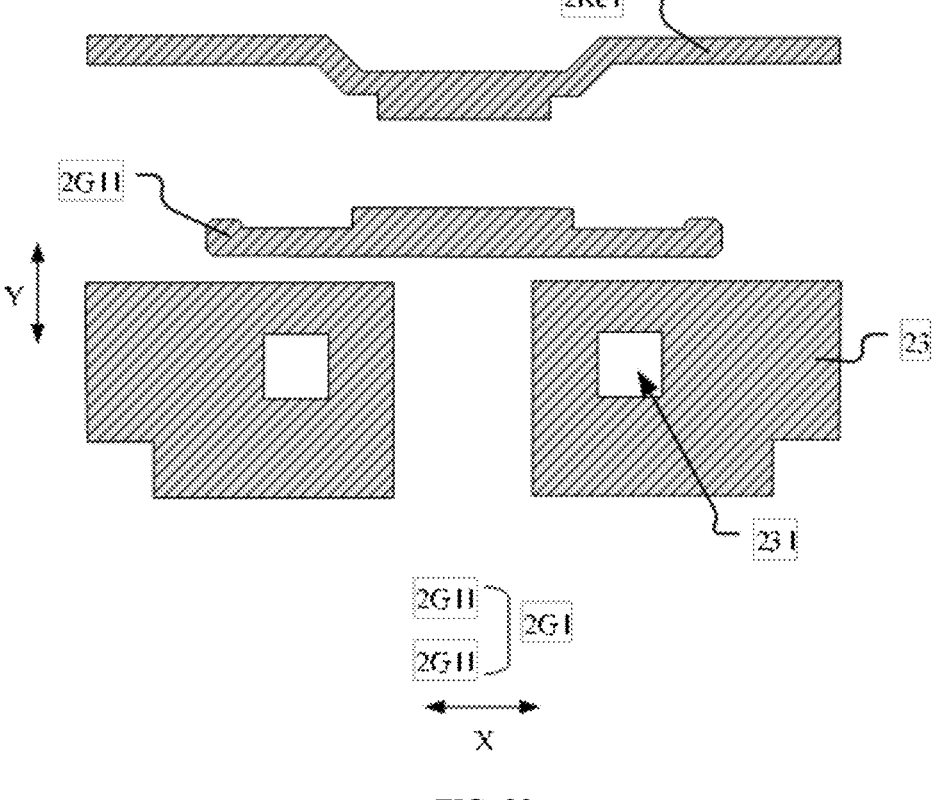
FIG. 22 is a structural layout of the second conductive layer in FIG. 18.
Figure 23:
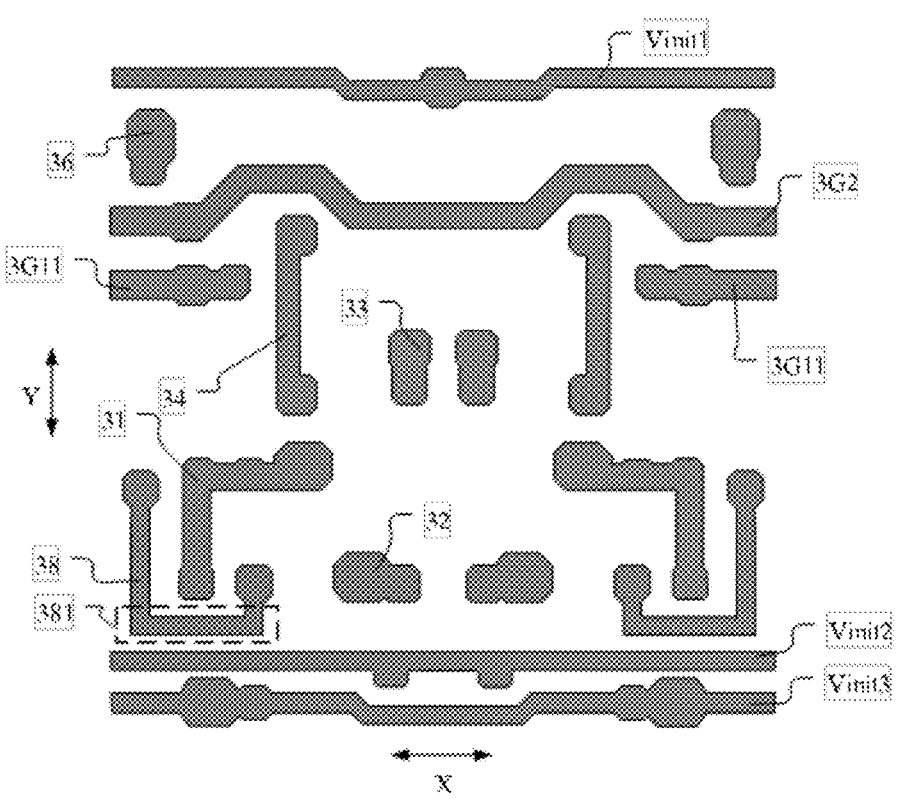
FIG. 23 is a structural layout of the third conductive layer in FIG. 18.
Figure 25:
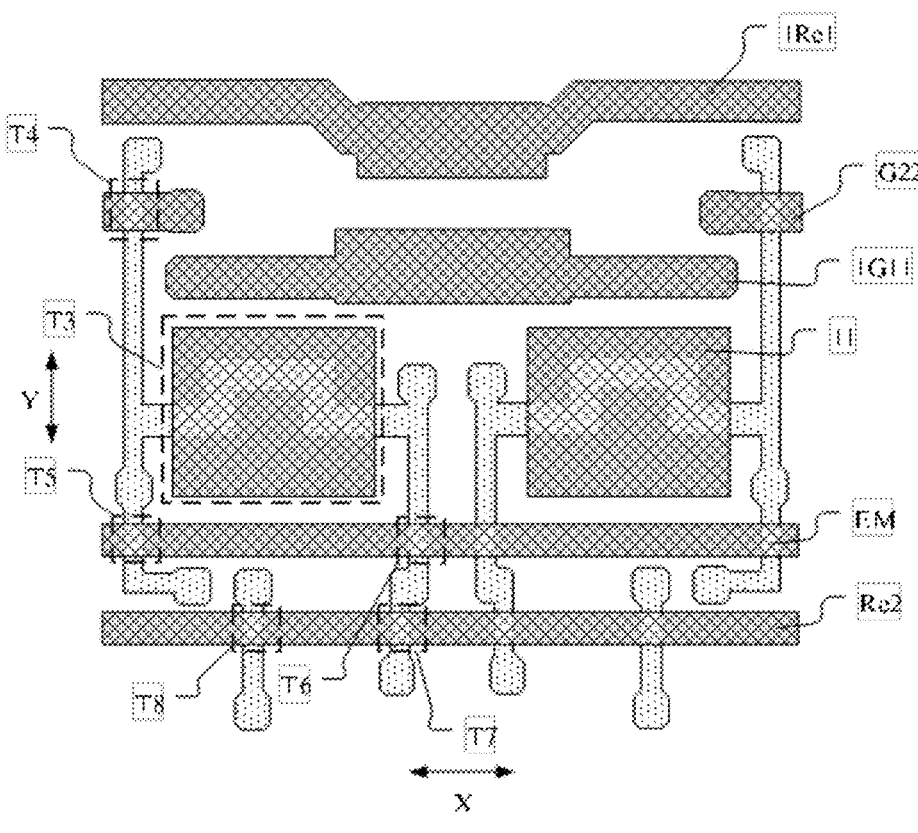
FIG. 25 is a structural layout of the first active layer and the first conductive layer in FIG. 18.
Figure 26:
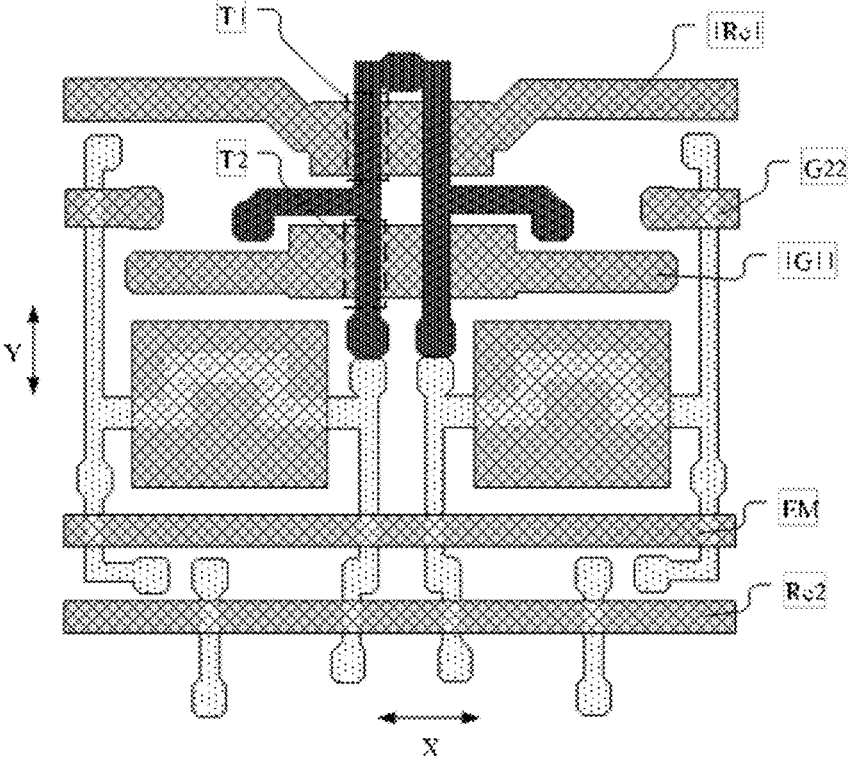
FIG. 26 is a structural layout of the first active layer, the first conductive layer, and the second active layer in FIG. 18.
Figure 27:
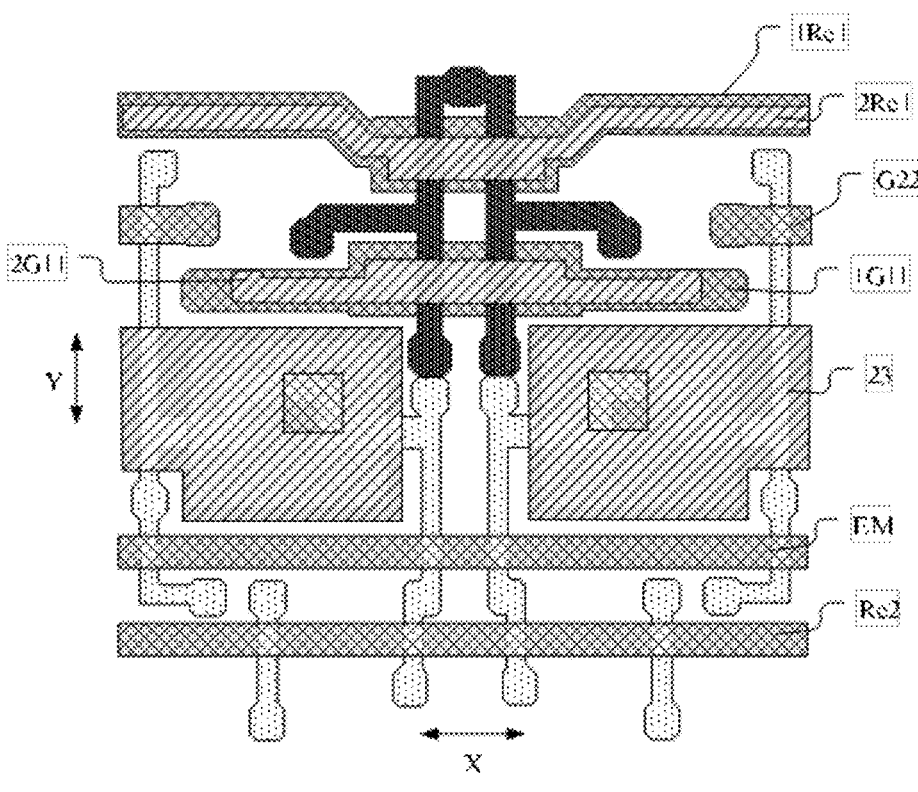
FIG. 27 is a structural layout of the first active layer, the first conductive layer, the second active layer, and the second conductive layer in FIG. 18.
Figure 28:
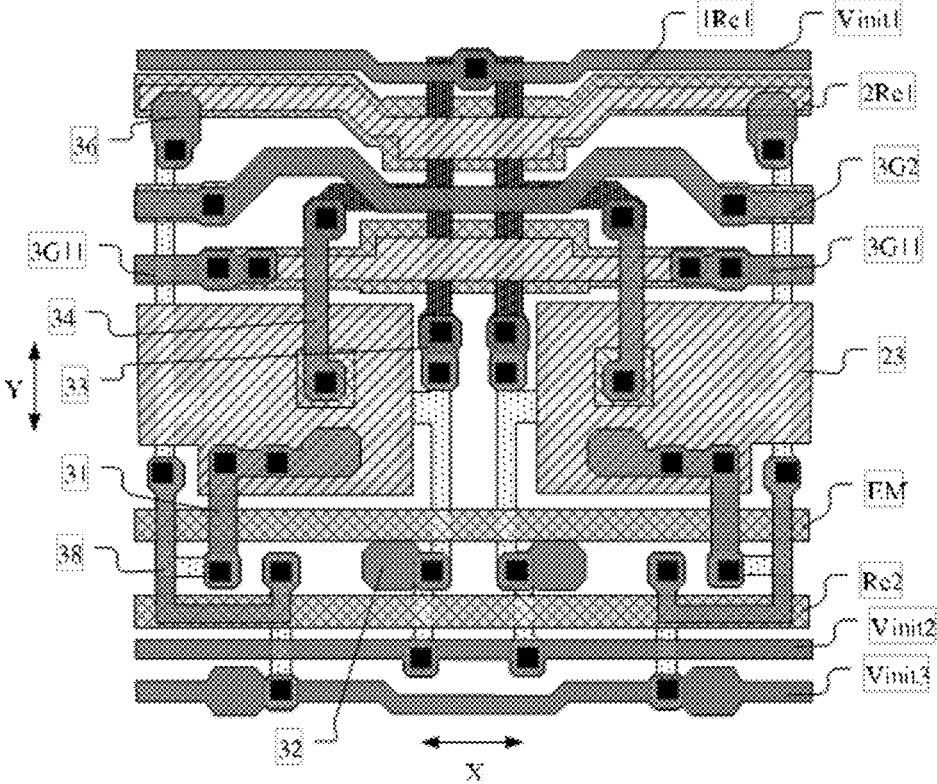
FIG. 28 is a structural layout of the first active layer, the first conductive layer, the second active layer, the second conductive layer, and the third conductive layer in FIG. 18.

Embodiments of the present disclosure also provide another display panel, which may also include a base substrate, a first active layer, a first conductive layer, a second active layer, a second conductive layer, a third conductive layer and a fourth conductive layer stacked in sequence, where an insulation layer may be provided between the above-mentioned adjacent layers. As shown in FIG. 18-FIG. 28, FIG. 18 is a structural layout of a display panel according to some embodiments of the present disclosure, FIG. 19 is a structural layout of the first active layer in FIG. 18, FIG. 20 is a structural layout of the first conductive layer in FIG. 18, FIG. 21 is the structural layout of the second active layer in FIG. 18, FIG. 22 is the structural layout of the second conductive layer in FIG. 18, FIG. 23 is the structural layout of the third conductive layer in FIG. 18, FIG. 24 It is the structural layout of the fourth conductive layer in FIG. 18, FIG. 25 is the structural layout of the first active layer and the first conductive layer in FIG. 18, FIG. 26 is the first active layer, the first conductive layer, and the second active layer in FIG. 18, FIG. 27 is the structural layout of the first active layer, the first conductive layer, the second active layer, and the second conductive layer in FIG. 18, and FIG. 28 is the structural layout of the first active layer, the first conductive layer, the second active layer, the second conductive layer, and the third conductive layer in FIG. 18. The display panel may include more than one pixel driving circuit shown in FIG. 1. As shown in FIG. 18, the more than one pixel driving circuit may include a first pixel driving circuit P1 and a second pixel driving circuit P2 adjacently distributed in the first direction X, the first pixel driving circuit P1 and the second pixel driving circuit P2 can be provided mirror-symmetrically to the mirror-symmetric plane BB. Among them, the mirror-symmetric plane BB may be perpendicular to the base substrate. In addition, the orthographic projection of the first pixel driving circuit P1 on the base substrate and the orthographic projection of the second pixel driving circuit P2 on the base substrate may be provided symmetrically taking the intersection line of the mirror-symmetric plane BB and the base substrate as a symmetrical axis. Among them, the first pixel driving circuit P1 and the second pixel driving circuit P2 may form a repeating unit, and the display panel may include more than one repeating unit distributed in an array in the first direction X and the second direction Y.

As shown in FIG. 18, FIG. 19, and FIG. 25, the first active layer may include a third active part 73, a fourth active part 74, a fifth active part 75, a sixth active part 76, a seventh active part 77, and an eighth active part 78. Among them, the third active part 73 can be used to form the channel region of the driving transistor T3; the fourth active part 74 can be used to form the channel region of the fourth transistor T4; the fifth active part 75 can be used to form the channel region of the fifth transistor T5; the sixth active part 76 can be used to form the channel region of the sixth transistor T6; the seventh active part 77 can be used to form the channel region of the seventh transistor T7; and the eighth active part 76 can be used to form the channel region of the eighth transistor 78. The first active layer further includes a ninth active part 79, a tenth active part 710, a eleventh active part 711, a twelfth active part 712, a thirteenth active part 713, a seventeenth active part 717, a eighteenth active part 718, and a twentieth active part 720. Among them, the ninth active part 79 is connected to an end of the fifth active part 75 away from the third active part 73. The tenth active part 710 is connected between the sixth active part 76 and the seventh active part 77, the eleventh active part 711 is connected between the sixth active part 76 and the third active part 73, the twelfth active part 712 is connected to an end of the fourth active part 74 away from the third active part 73, the thirteenth active part 713 is connected to an end of the seventh active part 77 away from the sixth active part 76, the seventeenth active part 717 and the eighteenth active part 718 are respectively connected to two ends of the eighth active part 78, and the twentieth active part 720 is connected between the third active part 73 and the fifth active part 75. The first active layer can be formed of polysilicon material, and correspondingly, the driving transistor T3, the fourth transistor T4, the fifth transistor T5, the sixth transistor T6, the seventh transistor T7, and the eighth transistor T8 can be P-type low-temperature polysilicon thin film transistors.

As shown in FIG. 18, FIG. 20, and FIG. 25, the first conductive layer may include a first conductive part 11, a second gate line G2, an enabling signal line EM, a second reset signal line Re2, a first gate line 1G1, and a first reset signal line 1Re1. The second gate line G2 can be used to provide the second gate driving signal end in FIG. 1; the enabling signal line EM can be used to provide the enabling signal end in FIG. 1; the second reset signal line Re2 can be used to provide the second reset signal end in FIG. 1; the first gate line 1G1 is used to provide the first gate driving signal end in FIG. 1, and the first reset signal line 1Re1 is used to provide the first reset signal end in FIG. 1. The orthographic projection of the enabling signal line EM on the base substrate, the orthographic projection of the first reset signal line 1Re1 on the base substrate, the orthographic projection of the second reset signal line Re2 on the base substrate, the orthographic projection of the first gate line 1G1 on the base substrate and the orthographic projection of the second gate line G2 on the base substrate may all extend along the first direction X. The second gate line G2 may include more than one second gate line segment G22, and the orthographic projections of the more than one second gate line segment G22 in the same second gate line G2 on the base substrate are distributed at intervals along the first direction X and extend along the first direction X, the orthographic projection of the second gate line segment G22 on the base substrate covers the orthographic projection of the fourth active part 74 on the base substrate, and partial structure of the second gate line segment G22 is used to form the gate of the fourth transistor T4. The orthographic projection of the enabling signal line EM on the base substrate covers the orthographic projection of the fifth active part 75 on the base substrate and the orthographic projection of the sixth active part 76 on the base substrate, partial structure of the enabling signal line EM can be used to form the gate of the fifth transistor T5, and another partial structure of the enabling signal line EM can be used to form the gate of the sixth transistor T6. The orthographic projection of the second reset signal line Re2 on the base substrate can cover the orthographic projection of the seventh active part 77 on the base substrate and the orthographic projection of the eighth active part 78 on the base substrate, partial structure of the second reset signal line Re2 can be used to form the gate of the seventh transistor T7, and another partial structure of the second reset signal line Re2 can be used to form the gate of the eighth transistor T8. The orthographic projection of the first conductive part 11 on the base substrate covers the orthographic projection of the third active part 73 on the base substrate, and the first conductive part 11 can be used to form the gate of the driving transistor T3 and the first electrode of the capacitor C. The first gate line 1G1 includes more than one first gate line segment 1G11, and the orthographic projections of the more than one first gate line segment 1G11 in the same first gate line 1G1 are distributed along the first direction X at intervals and extend along the first direction X. In addition, the display panel can use the first conductive layer as a mask to perform conductorization treatment on the first active layer, that is, the region covered by the first conductive layer in the first active layer can form the channel region of the transistor, and the region not covered by the first conductive layer in the first active layer forms a conductor structure.

As shown in FIG. 18, FIG. 21, and FIG. 26, the second active layer may include a first active part 81, a second active part 82, a fourteenth active part 814, a fifteenth active part 815, and a sixteenth active part 816. The first active part 81 is used to form the channel region of the first transistor T1, and the second active part 82 is used to form the channel region of the second transistor T2. The fifteenth active part 815 is connected between the first active part 81 and the second active part 82. The fourteenth active part 814 is connected to an end of the first active part 81 away from the fifteenth active part 815, and the sixteenth active part 816 is connected to an end of the second active part 82 away from the first active part 81. Among them, the second active layer may be formed of indium gallium zinc oxide, and correspondingly, the first transistor T1 and the second transistor T2 may be N-type metal oxide thin film transistors. The orthographic projection of the first gate line 1G1 on the base substrate may cover the orthographic projection of the second active part 82 on the base substrate, and partial structure of the first gate line 1G1 may be used to form the bottom gate of the second transistor T2. The orthographic projection of the first reset signal line 1Re1 on the base substrate can cover the orthographic projection of the first active part 81 on the base substrate, and partial structure of the first reset signal line 1Re1 can be used to form the bottom gate of the first transistor T1.

As shown in FIG. 18, FIG. 22, and FIG. 27, the second conductive layer may include a third reset signal line 2Re1, a third gate line 2G1, and a third conductive part 23. Among them, the third reset signal line 2Re1 can be used to provide the first reset signal end in FIG. 1, and the third gate line 2G1 can be used to provide the first gate driving signal end in FIG. 1. The orthographic projection of the third reset signal line 2Re1 on the base substrate can cover the orthographic projection of the first active part 71 on the base substrate, and partial structure of the third reset signal line 2Re1 can be used to form the top gate of the first transistor T1. The third gate line 2G1 may include more than one third gate line segment 2G11, and the orthographic projections of the more than one third gate line segment 2G11 in the same third gate line 2G1 on the base substrate are distributed at intervals along the first direction X and extend along the first direction X, the orthographic projection of the third gate line segment 2G11 on the base substrate can cover the orthographic projection of the second active part 72 on the base substrate, and partial structure of the third gate line segment 2G11 can be used to form the top gate of the second transistor T2. The orthographic projection of the third conductive part 23 on the base substrate at least partially overlaps with the orthographic projection of the first conductive part 11 on the base substrate, and the third conductive part 23 is used to form the second electrode of the capacitor C. In adjacent repeating units, adjacent third conductive parts may be connected to each other. In addition, the display panel can use the second conductive layer as a mask to perform conductorization treatment on the second active layer, that is, the region covered by the second conductive layer in the second active layer can form the channel region of the transistor, and the region not covered by the second conductive layer in the second active layer forms a conductor structure.

As shown in FIG. 18, FIG. 23, and FIG. 28, the third conductive layer may include a first bridging part 31, a second bridging part 32, a third bridging part 33, a fourth bridging part 34, a sixth bridging part 36, an eighth bridging part 38, a first initial signal line Vinit1, a second initial signal line Vinit2, a third initial signal line Vinit3, a first gate connection line segment 3G11, and a second gate connection line 3G2. The orthographic projection of the first initial signal line Vinit1 on the base substrate, the orthographic projection of the second initial signal line Vinit2 on the base substrate, the orthographic projection of the third initial signal line Vinit3 on the base substrate, the orthographic projection of the first gate connection line segment 3G11 on the base substrate and the orthographic projection of the second gate connection line 3G2 on the base substrate may all extend along the first direction X. The first initial signal line Vinit1 is used to provide a first initial signal end, the second initial signal line Vinit2 is used to provide a second initial signal end, and the third initial signal line Vinit3 is used to provide a third initial signal end. The first bridging part 31 can be connected to the ninth active part 79 and the third conductive part 23 respectively through via holes, so as to connect the first electrode of the fifth transistor and the second electrode of the capacitor C. The second bridging part 32 may be connected to the tenth active part 710 through a via hole, so as to connect the second electrode of the sixth transistor T6 and the second electrode of the seventh transistor T7. The third bridging part 33 can be connected to the eleventh active part 711 and the sixteenth active part 816 respectively through via holes, so as to connect the second electrode of the second transistor T2, the first electrode of the sixth transistor T6, and the second electrode of the driving transistor T3. The fourth bridging part 34 can be connected to the fifteenth active part 815 and the first conductive part 11 respectively through via holes, so as to connect the first electrode of the second transistor T2 and the gate of the driving transistor. As shown in FIG. 22 and FIG. 28, an opening 231 is formed on the third conductive part 23, and the orthographic projection of the via hole connected between the first conductive part 11 and the fourth bridging part 34 on the base substrate is located within the orthographic projection of the opening 231 on the base substrate, so that the conductive structure in the via hole and the third conductive part 23 are insulated from each other. The eighth bridging part 38 may be connected to the seventeenth active part 717 and the twentieth active part 720 respectively through via holes, so as to connect the second electrode of the eighth transistor and the first electrode of the driving transistor. The first initial signal line Vinit1 can be connected to the fourteenth active part 814 through a via hole, so as to connect the first initial signal end and the first electrode of the first transistor T1. The second initial signal line Vinit2 can be connected to the thirteenth active part 713 through a via hole, so as to connect the second initial signal end and the first electrode of the seventh transistor. The third initial signal line Vinit3 is connected to the eighteenth active part 718 through a via hole, so as to connect the first electrode of the eighth transistor to the third initial signal end. The orthographic projection of the fourth bridging part 34 on the base substrate may intersect with the orthographic projection of the first gate line segment 1G11 on the base substrate, and the orthographic projection of the first gate connection line segment 3G11 on the base substrate is located between the orthographic projections of two fourth bridging parts 34 adjacent in the first direction X on the base substrate. The first gate connection line segment 3G11 can be connected to the first gate line segments 1G11 adjacent in the first direction X respectively through via holes, and connected to the third gate line segments 2G11 adjacent in the first direction X respectively through via holes. The second gate connection line 3G2 can be connected to more than one second gate line segments G22 in the same second gate line G2 respectively through via holes. In some embodiments, the sheet resistance of the third conductive layer may be smaller than the sheet resistances of the first conductive layer and the second conductive layer. The first gate connection line segment 3G11 can reduce the self-resistance of the gate line connected to the second transistor T2, thereby improving the response speed of the second transistor T2. The second gate connection line 3G2 can reduce the self-resistance of the gate line connected to the fourth transistor T4, thereby improving the response speed of the fourth transistor T4. As shown in FIG. 23, the eighth bridging part 38 may include a sub-bridging part 381. The orthographic projection of the sub-bridging part 381 on the base substrate may extend along the first direction X, and is located on the orthographic projection of the second reset signal line Re2 on the base substrate. This setting can improve the transmittance of the display panel.

Figure 24:
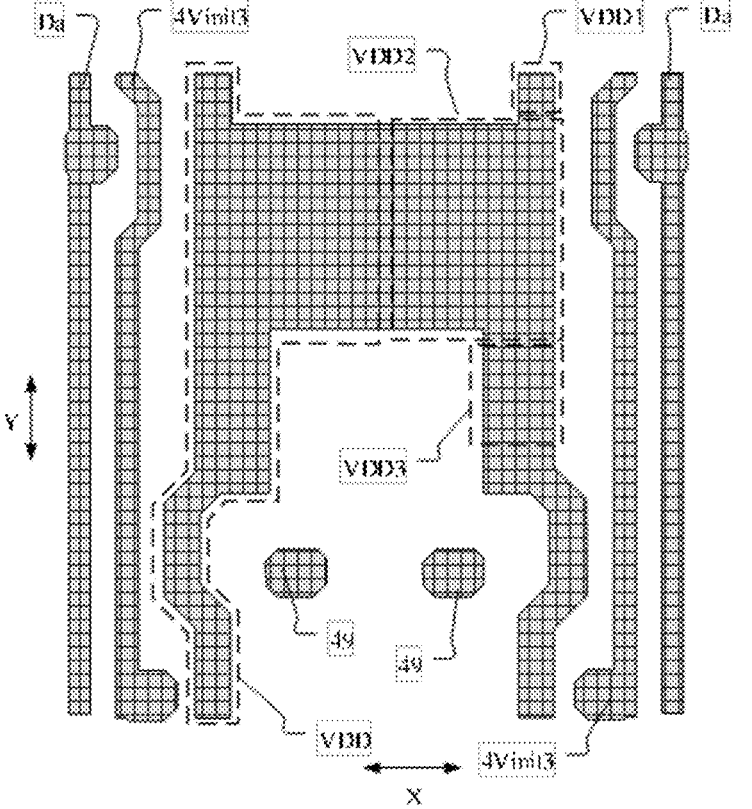
FIG. 24 is a structural layout of the fourth conductive layer in FIG. 18.

As shown in FIG. 18 and FIG. 24, the fourth conductive layer may include more than one third power line VDD, more than one data line Da, a sixth initial signal line 4Vinit3, and a ninth bridging part 49. Among them, the orthographic projection of the third power line VDD on the base substrate, the orthographic projection of the data line Da on the base substrate, and the orthographic projection of the sixth initial signal line 4Vinit3 on the base substrate can all extend along the second direction Y. The third power line VDD can be used to provide the first power end, and the data line Da can be used to provide a data signal end. As shown in FIG. 18 and FIG. 24, each column of pixel driving circuits may be correspondingly provided with one third power supply line VDD, one sixth initial signal line 4Vinit3, and one data line Da. The third power line VDD can be connected to the first bridging part 31 through a via hole, so as to connect the first electrode of the fifth transistor and the first power end. The third power line VDD may include a first extension part VDD1, a second extension part VDD2, and a third extension part VDD3. The second extension part VDD2 is connected between the first extension part VDD1 and the third extension part VDD3. The size of the orthographic projection of the second extension part VDD2 on the base substrate in the first direction X may be larger than the size of the orthographic projection of the first extension part VDD1 on the base substrate in the first direction X, and the size of the orthographic projection of the second extension part VDD2 on the base substrate in the first direction X may be larger than the size of the orthographic projection of the third extension part VDD3 on the base substrate in the first direction X. The orthographic projection of the second extension part VDD2 on the base substrate can cover the orthographic projection of the first active part 81 on the base substrate and the orthographic projection of the second active part 82 on the base substrate. The second extension part VDD2 can reduce the influence of light on the characteristics of the first transistor T1 and the second transistor T2. In addition, the orthographic projection of the third power line VDD on the base substrate can cover the orthographic projection of the fourth bridging part 34 on the base substrate, and the third power line VDD can be used to shield the noise interference of other signals on the fourth bridging part 34, thereby improving the stability of the gate voltage of the driving transistor T3. In addition, in a same repeating unit, the second extension parts VDD2 in two adjacent pixel driving circuits can be connected to each other, so that the third power line VDD and the third conductive part 23 can form a grid structure, and the power line of the grid structure can reduce the voltage drop of the power signal across it. The data line Da can be connected to the sixth bridging part 36 through a via hole, so as to connect the first electrode of the fourth transistor and the data signal end. The ninth bridging part 49 may be connected to the second bridging part 32 through a via hole, so as to be connected to the second electrode of the seventh transistor.

The sixth initial signal line 4Vinit3 may be connected to the third initial signal line Vinit3 that intersects with it through a via hole to form a grid structure. In a same row of pixel driving circuits, the orthographic projection of the sixth initial signal line 4Vinit3 on the base substrate can be located between the orthographic projection of the data line Da on the base substrate and the orthographic projection of the third power line VDD on the base substrate. The sixth initial signal line 4Vinit3 can be used to shield the signal interference between the data line Da and the third power line VDD.

Figure 29:
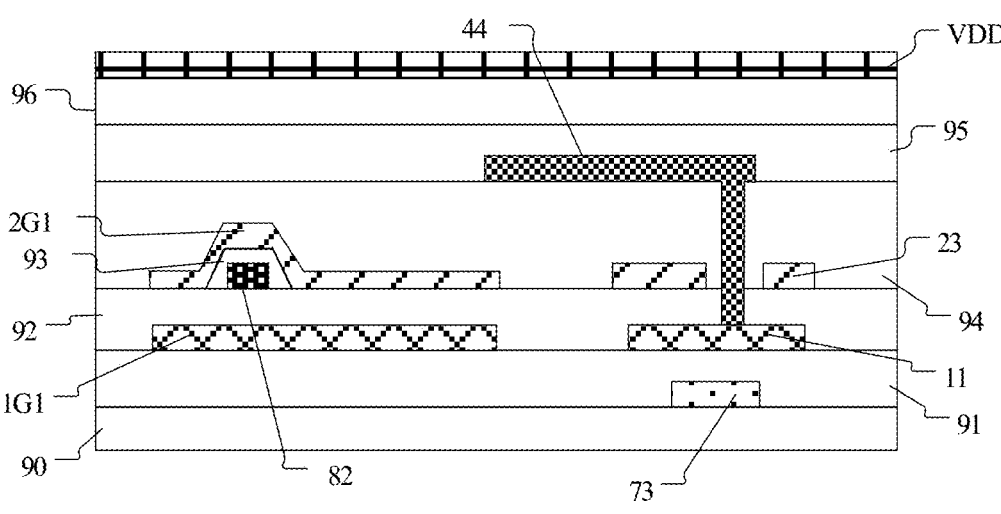
FIG. 29 is a partial cross-sectional view of the display panel shown in FIG. 18 taken along the dotted line AA.

As shown in FIG. 29, it is a partial cross-sectional view of the display panel shown in FIG. 18 taken along the dotted line AA. The display panel may further include a first insulation layer 91, a buffer layer 92, a second insulation layer 93, a dielectric layer 94, a passivation layer 95, and a flat layer 96. Among them, the base substrate 90, the first active layer, the first insulation layer 91, the first conductive layer, the buffer layer 92, the second active layer, the second insulation layer 93, the second conductive layer, the dielectric layer 94, the third conductive layer, the passivation layer 95, the flat layer 96, and the fourth conductive layer are stacked in sequence. The thickness of the buffer layer 92 may be larger than that of the second insulation layer 93. The first insulation layer 91 and the second insulation layer 93 can be of a single-layer structure or a multi-layer structure, and the materials of the first insulation layer 91 and the second insulation layer 93 can be at least one of silicon nitride, silicon oxide, and silicon oxynitride; the buffer layer 92 can include at least one of a silicon oxide layer and a silicon nitride layer; the dielectric layer 94 can be a silicon nitride layer; the passivation layer 95 can be a silicon oxide layer; the material of the flat layer 96 can be an organic material, such as polyimide (PI), polyethylene terephthalate (PET), polyethylene naphthalate (PEN), silicon-glass bonding structure (SOG) and other materials. The base substrate 90 may include a glass substrate, a barrier layer, and a polyimide layer stacked in sequence, and the barrier layer may be of an inorganic material. The materials of the first conductive layer and the second conductive layer may be one or an alloy of molybdenum, aluminum, copper, titanium, niobium, or a molybdenum/titanium alloy or laminate, etc. The materials of the third conductive layer and the fourth conductive layer may include metal materials, such as one or an alloy of molybdenum, aluminum, copper, titanium, niobium, or a molybdenum/titanium alloy or laminate, etc., or titanium/aluminum/titanium laminate. The display panel may further include an electrode layer located on the side of the fourth conductive layer away from the base substrate, a pixel defining layer located on the side of the electrode layer away from the base substrate, and a light emitting material layer located on the side of the pixel defining layer away from the base substrate. The common electrode layer is located on the side of the light emitting material layer away from the base substrate.

In some embodiments, the second insulation layer 93 may be a patterned structure, for example, the second insulation layer 93 may only be located between the second active layer and the second conductive layer. The second insulation layer 93 may not be provided between the third conductive part 23 and the first conductive part 11, which can reduce the distance between the third conductive part 23 and the first conductive part 11, thereby increasing the capacity of the capacitor C. It should be understood that, in some embodiments, the thickness of local second insulation layer 93 and/or buffer layer 92 between the third conductive part 23 and the first conductive part 11 can also be reduced, so as to reduce the distance between the third conductive part 23 and the first conductive part 11. For example, the distance between the third conductive part 23 and the first conductive part 11 in the thickness direction of the display panel may be smaller than the distance between the third gate line 2G1 and the first gate line 1G1 in the thickness direction of the display panel.

Figure 30:
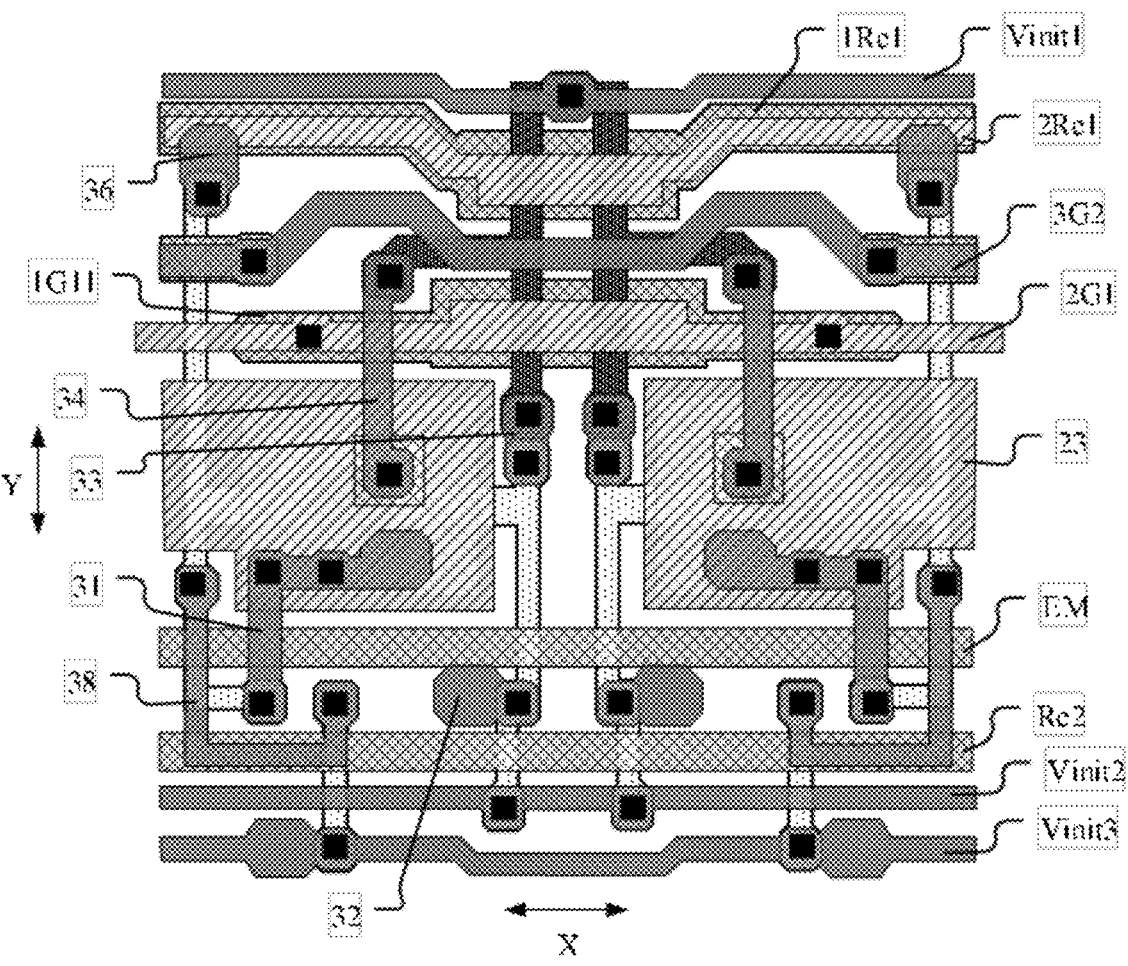
FIG. 30 is a schematic structural diagram of a display panel according to some embodiments of the present disclosure.

As shown in FIG. 30, it is a schematic structural diagram of the display panel according to some embodiments of the present disclosure. Compared with the display panel shown in FIG. 18, the third gate line 2G1 in the display panel shown in FIG. 30 extends continuously in the first direction X, that is, the third gate line 2G1 is not disconnected. The third gate line 2G1 may be connect to more than one first gate line segment 1G11 in the same first gate line 1G1 through via holes.

Figure 31:
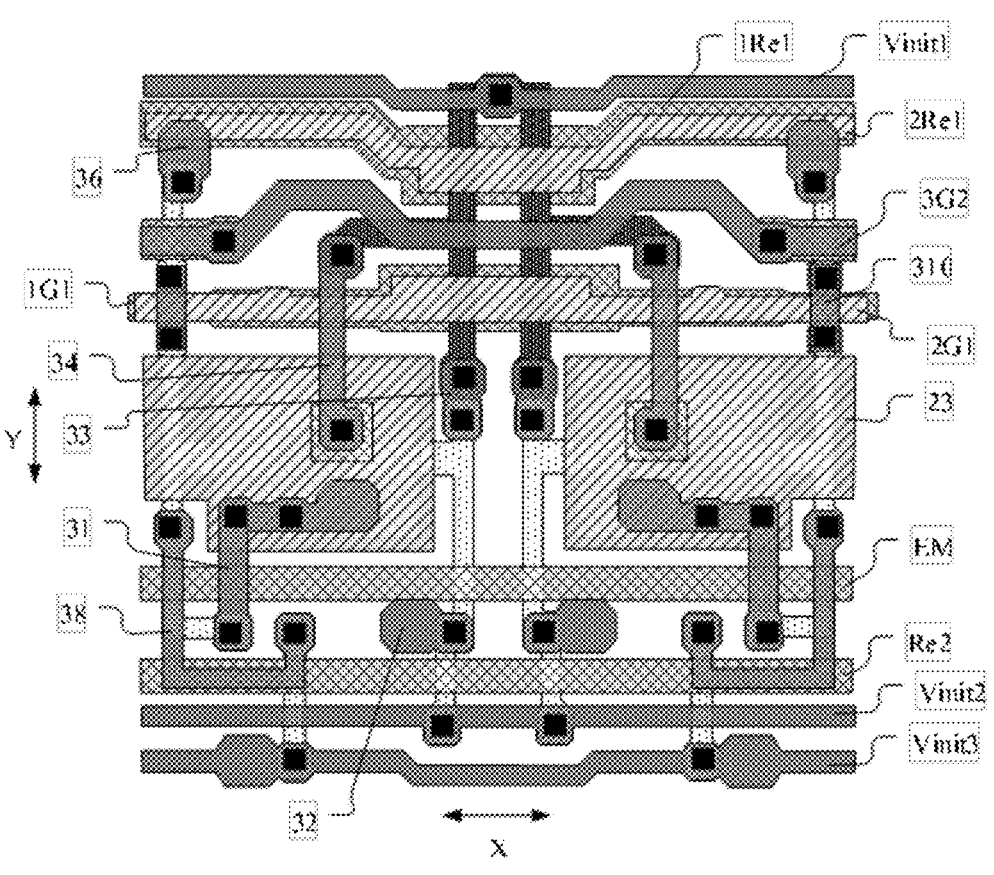
FIG. 31 is a schematic structural diagram of a display panel according to some embodiments of the present disclosure.
Figure 32:
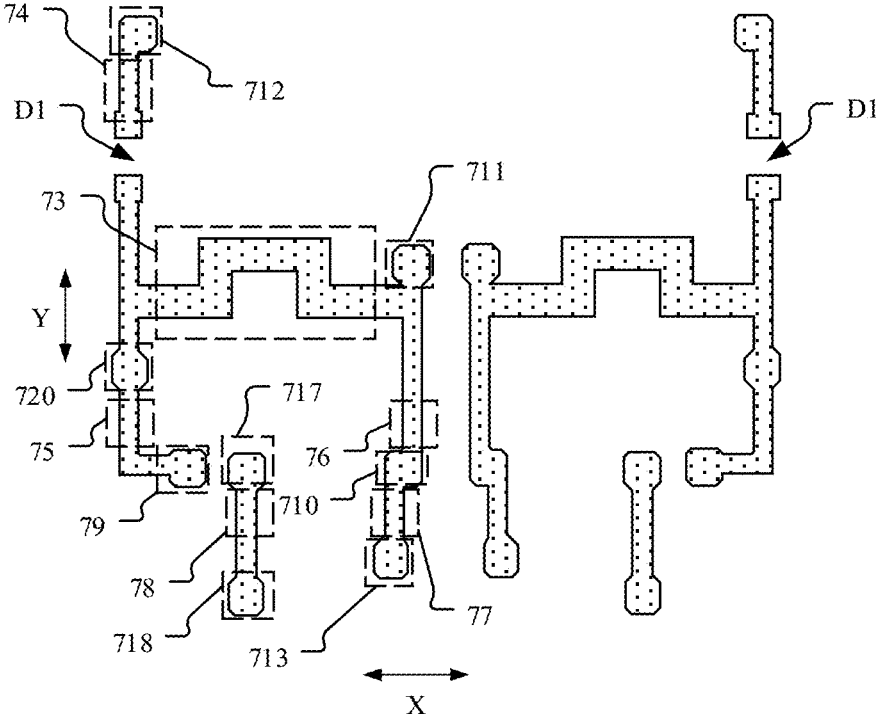
FIG. 32 is a structural layout of the first active layer in FIG. 31.

As shown in FIG. 31 and FIG. 32, FIG. 31 is a schematic structural diagram of the display panel according to some embodiments of the present disclosure, and FIG. 32 is a structural layout of the first active layer in FIG. 31. Compared with the display panel shown in FIG. 18, a fracture DI is formed between the fourth active part 74 and the third active part 73 in the display panel shown in FIG. 31. The third conductive layer includes a tenth bridging part 310, and the tenth bridging part 310 is connected between the fourth active part 74 and the third active part 73 through a via hole. The first gate line 1G1 extends continuously in the first direction X, and the third gate line 2G1 extends continuously in the first direction X. The orthographic projection of the first gate line 1G1 on the base substrate is located within the orthographic projection of the fracture DI on the base substrate, and intersects with the orthographic projection of the tenth bridging part 310 on the base substrate. The orthographic projection of the third gate line 2G1 on the base substrate is located within the orthographic projection of the fracture DI on the base substrate, and intersects with the orthographic projection of the tenth bridging part 310 on the base substrate.

It should be noted that, as shown in FIG. 2, FIG. 12, FIG. 18, FIG. 28, FIG. 30, and FIG. 31, the black blocks drawn on the side of the third conductive layer away from the base substrate indicate that the via holes by which the third conductive layer is connected to other layers facing the side of the base substrate; the black blocks drawn on the side of the fourth conductive layer away from the base substrate indicates that via holes by which the fourth conductive layer is connected to other layers facing the side of the base substrate. The black blocks only indicate the position of the via holes, and different via holes indicated by black blocks at different positions may penetrate through different insulation layers.

It should be noted that the scale of the drawings in the present disclosure can be used as a reference in the actual process, but is not limited to this, for example, the width-to-length ratio of the channel, the thickness and spacing of each film layer, and the width and spacing of each signal line, can be adjusted according to actual needs. The number of pixels in the display substrate and the number of sub-pixels in each pixel are not limited to the numbers shown in the drawings, and the drawings described in the present disclosure are only structural schematic diagrams. In addition, the first, second and other qualifiers are only used to define different structural names, and they have no meaning of a specific order. The same structural layer in the present disclosure can be formed through one patterning process.

Embodiments of the present disclosure also provide a display device, which includes the above-mentioned display panel. The display device may be a display device such as a mobile phone, a tablet computer, or a television.

Those skilled in the art will easily think of other embodiments of the present disclosure after considering the description and practicing the contents disclosed here. The present application is intended to cover any variant, use or adaptive change of the present disclosure. These variants, uses or adaptive changes follow the general principles of the present disclosure and include the common knowledge or conventional technical means in the technical field not disclosed in the present disclosure. The description and the embodiments are only regarded as illustrative. The true scope and spirit of the present disclosure are indicated by the claims.

It should be understood that the present disclosure is not limited to the precise structure described above and shown in the drawings, and various modifications and changes can be made without departing from its scope. The scope of the present disclosure is limited only by the appended claims.

What is claimed is:

1. A display panel, wherein the display panel comprises a pixel driving circuit, the pixel driving circuit comprises a first type transistor and a second type transistor, and the display panel further comprises:

a base substrate;

a first active layer, located on a side of the base substrate, wherein at least a partial structure of the first active layer is used to form a channel region of the first type transistor;

a second active layer, located on a side of the first active layer away from the base substrate, wherein at least a partial structure of the second active layer is used to form a channel region of the second type transistor; and a first conductive layer, located between the first active layer and the second active layer, wherein a partial structure of the first conductive layer is used to form a gate of the first type transistor, and another partial structure of the first conductive layer is used to form a bottom gate of the second type transistor;

wherein the pixel driving circuit further comprises a capacitor, the first conductive layer comprises a first conductive part, and the first conductive part is used to form a first electrode of the capacitor; and the display panel further comprises: a second conductive layer, located on a side of the second active layer away from the base substrate, wherein the second conductive layer comprises a third conductive part, an orthographic projection of the third conductive part on the base substrate at least partially overlaps with an orthographic projection of the first conductive part on the base substrate, and the third conductive part is used to form a second electrode of the capacitor; wherein, a partial structure of the second conductive layer is further used to form a top gate of the second type transistor;

wherein the pixel driving circuit further comprises a driving transistor, a first transistor, and a second transistor, the driving transistor is the first type transistor, and the first transistor and the second transistor are second type transistors; a first electrode of the first transistor is connected to a first initial signal line, a second electrode of the first transistor is connected to a gate of the driving transistor, a first electrode of the second transistor is connected to the gate of the driving transistor, a second electrode of the second transistor is connected to a second electrode of the driving transistor, and the first electrode of the capacitor is connected to the gate of the driving transistor; the first active layer comprises a third active part used to form a channel region of the driving transistor; the second active layer comprises a first active part and a second active part, the first active part is used to form a channel region of the first transistor, and the second active part is used to forming a channel region of the second transistor; the first conductive layer further comprises a first gate line, and a first reset signal line; wherein, the orthographic projection of the first conductive part on the base substrate covers an orthographic projection of the third active part on the base substrate, and the first conductive part is further used to form the gate of the driving transistor; an orthographic projection of the first reset signal line on the base substrate covers an orthographic projection of the first active part on the base substrate, and a partial structure of the first reset signal line is used to form a bottom gate of the first transistor; an orthographic projection of the first gate line on the base substrate covers an orthographic projection of the second active part on the base substrate, and a partial structure of the first gate line is used to form a bottom gate of the second transistor; the second conductive layer further comprises a third gate line, and a third reset signal line; wherein, an orthographic projection of the third reset signal line on the base substrate covers the orthographic projection of the first active part on the base substrate, and a partial structure of the third reset signal line is used to form a top gate of the first transistor; an orthographic projection of the third gate line on the base substrate covers the orthographic projection of the second active part on the base substrate, and a partial structure of the third gate line is used to form the bottom gate of the second transistor; wherein the pixel driving circuit further comprises a fourth transistor, a first electrode of the fourth transistor is connected to a data line, and a second electrode of the fourth transistor is connected to a first electrode of the driving transistor, and the fourth transistor is the first type transistor; the first active layer further comprises a fourth active part used to form a channel region of the fourth transistor; the first conductive layer further comprises a second gate line, an orthographic projection of the second gate line on the base substrate covers an orthographic projection of the fourth active part on the base substrate, and a partial structure of the second gate line is used to form a gate of the fourth transistor; wherein, the orthographic projection of the first gate line on the base substrate, the orthographic projection of the second gate line on the base substrate, and the orthographic projection of the first reset signal line on the base substrate all extend along a first direction; the orthographic projection of the second gate line on the base substrate is located on a side of the orthographic projection of the first gate line on the base substrate away from the orthographic projection of the first conductive part on the base substrate; the orthographic projection of the first reset signal line on the base substrate is located on a side of the orthographic projection of the second gate line on the base substrate away from the orthographic projection of the first conductive part on the base substrate.

2. The display panel according to claim 1, wherein the pixel driving circuit further comprises an eighth transistor, a first electrode of the eighth transistor is connected to a third initial signal line, and a second electrode of the eighth transistor is connected to the first electrode of the driving transistor.

3. The display panel according to claim 1, wherein the first gate line comprises more than one first gate line segment, and orthographic projections of more than one first gate line segment in a same first gate line extend along the first direction and are distributed at intervals along the first direction;

the second active layer further comprises a fifteenth active part connected between the first active part and the second active part;

the first conductive layer further comprises a second conductive part, an orthographic projection of the second conductive part on the base substrate extends along a second direction and is located between orthographic projections of two first gate line segments adjacent in the first direction on the base substrate, the second direction intersects with the first direction, and the second conductive part is respectively connected to the fifteenth active part and the first conductive part;

the display panel further comprises:

a third conductive layer, located on a side of the second conductive layer away from the base substrate, wherein the third conductive layer comprises a first gate connection line, and an orthographic projection the first gate connection line on the base substrate extends along the first direction and intersects with the orthographic projection of the second conductive part on the base substrate, and the first gate connection line is connected to the more than one first gate line segment in the same first gate line respectively through a via hole.

4. The display panel according to claim 1, wherein the first gate line comprises more than one first gate line segment, and orthographic projections of more than one first gate line segment in a same first gate line on the base substrate extend along the first direction and are distributed at intervals along the first direction;

the second active layer further comprises a fifteenth active part connected between the first active part and the second active part;

the display panel further comprises:

a third conductive layer, located on a side of the second conductive layer away from the base substrate, wherein the third conductive layer comprises a first gate connection line segment and a fourth bridging part, and an orthographic projection of the fourth bridging part on the base substrate extends along a second direction, the second direction intersects with the first direction, and the fourth bridging part is connected to the fifteenth active part and the first conductive part respectively through a via hole;

wherein, the orthographic projection of the fourth bridging part on the base substrate intersects with an orthographic projection of the first gate line segment on the base substrate, and an orthographic projection on the first gate connection line segment on the base substrate is located between orthographic projections of two fourth bridging parts adjacent in the first direction on the base substrate, and the first gate connection line segment is connected between two first gate line segments adjacent in first direction.

5. The display panel according to claim 1, wherein the first gate line comprises more than one first gate line segment, and orthographic projections of more than one first gate line segment in a same first gate line on the base substrate extend along the first direction and are distributed at intervals along the first direction;

the second conductive layer comprises the third gate line, an orthographic projection of the third gate line on the base substrate extends along the first direction, and the third gate line is connected to more than one first gate line segment in the same first gate line through a via hole.

6. The display panel according to claim 1, wherein the display panel further comprises:

a third conductive layer, located on a side of the second conductive layer away from the base substrate, wherein the third conductive layer comprises a tenth bridging part, and the tenth bridging part is connected between the fourth active part and the third active part;

the orthographic projection of the first gate line on the base substrate intersects with an orthographic projection of the tenth bridging part on the base substrate.

7. The display panel according to claim 1, wherein the third gate line comprises more than one third gate line segment, and orthographic projections of more than one third gate line segment in a same third gate line on the base substrate extend along the first direction and are distributed at intervals along the first direction;

the display panel further comprises:

a third conductive layer, located on a side of the second conductive layer away from the base substrate, wherein the third conductive layer comprises a first gate connection line, an orthographic projection of the first gate connection line on the base substrate extends along the first direction, and the first gate connection line is connected to the more than one third gate line segment in the same third gate line respectively through a via hole;

wherein a sheet resistance of the third conductive layer is smaller than a sheet resistance of the first conductive layer;

the sheet resistance of the third conductive layer is smaller than a sheet resistance of the second conductive layer.

8. The display panel according to claim 1, wherein the display panel further comprises:

a buffer layer, located between the first conductive layer and the second active layer;

a second insulation layer, located between the second active layer and the second conductive layer;

wherein, a thickness of the second insulation layer between the first conductive part and the third conductive part is smaller than a thickness of the second insulation layer between the top gate and the bottom gate of the second type transistor;

a thickness of the buffer layer between the first conductive part and the third conductive part is smaller than a thickness of the buffer layer between the top gate and the bottom gate of the second type transistor.

9. The display panel according to claim 1, wherein the display panel further comprises a fan-out region and more than one data line, and the first conductive layer further comprises:

a first data fan-out line, located in the fan-out region, wherein the first data fan-out line is connected to a data line corresponding to the first data fan-out line;

the second conductive layer further comprises:

a second data fan-out line, located in the fan-out region, wherein the second data fan-out line is connected to a data line corresponding to the second data fan-out line.

10. The display panel according to claim 1, wherein the second electrode of the capacitor is connected to a third power line;

the first active layer comprises a nineteenth active part, the nineteenth active part is connected between the third active part and the fourth active part, and a size of an orthographic projection of the nineteenth active part on the base substrate in the first direction is larger than a size of an orthographic projection of the fourth active part on the base substrate in the first direction;

the second conductive layer further comprises a fourth conductive part, the fourth conductive part is connected to the third conductive part, and an orthographic projection of the fourth conductive part on the base substrate at least partially overlaps with an orthographic projection of the nineteenth active part on the base substrate.

11. The display panel according to claim 1, wherein the display panel comprises a light emitting unit located in a display region, and the pixel driving circuit comprises a seventh transistor, and an eighth transistor;

the pixel driving circuit is connected to a first electrode of the light emitting unit, and a second electrode of the light emitting unit is connected to a first power line;

a first electrode of the seventh transistor is connected to a second initial signal line, and a second electrode of the seventh transistor is connected to the first electrode of the light emitting unit;

a first electrode of the eighth transistor is connected to a third initial signal line, and a second electrode of the eighth transistor is connected to the first electrode of the driving transistor;

the display panel further comprises:

more than one first signal line, located in a display region of the display panel, wherein an orthographic projection of the first signal line on the base substrate extends along the first direction;

more than one second signal line, located in the display region of the display panel, wherein an orthographic projection of the second signal line on the base substrate extends along a second direction, and the second direction intersects with the first direction, at least part of the second signal line is connected to at least part of the first signal line that intersects with the orthographic projection of the second signal line on the base substrate through a via hole;

the first signal line comprises at least one of the first power line, the first initial signal line, the second initial signal line and the third initial signal line, a same second signal line is connected to a same one of the first signal line, and the second signal line is connected to at least one of the first power line, the first initial signal line, the second initial signal line, and the third initial signal line.

12. The display panel according to claim 11, wherein the pixel driving circuit further comprises a fifth transistor, a first electrode of the fifth transistor is connected to a third power line, and a second electrode of the fifth transistor is connected to the first electrode of the driving transistor;

the display panel further comprises:

a fourth conductive layer, located on the side of the second active layer away from the base substrate, wherein the fourth conductive layer comprises the data line, the third power line, and the second signal line;

wherein, an orthographic projection of the data line on the base substrate and an orthographic projection of the third power line on the base substrate extend along the second direction, and in a same column of pixel driving circuits, an orthographic projection of the second signal line located in the fourth conductive layer on the base substrate is located between the orthographic projection of the data line on the base substrate and the orthographic projection of the third power line on the base substrate.

13. The display panel according to claim 1, wherein the display panel comprises more than one repeating unit distributed in an array along the first direction and a second direction, and the first direction intersects with the second direction;

a repeating unit comprises two pixel driving circuits distributed along the first direction, and two pixel driving circuits in a same repeating unit are mirror-symmetrically provided.

14. The display panel according to claim 13, wherein the first direction is a row direction, the second direction is a column direction, the second electrode of the capacitor is connected to a third power line;

the display panel further comprises:

a fourth conductive layer, located on a side of the second conductive layer away from the base substrate, wherein the fourth conductive layer comprises the third power line, and each column of the pixel driving circuits is correspondingly provided with one third power line, the third power line comprises a first extension part, a second extension part and a third extension part, and the second extension part is connected between the first extension part and the third extension part;

a size of an orthographic projection of the second extension part on the base substrate in the row direction is larger than a size of an orthographic projection of the first extension part on the base substrate in the row direction, and the size of the orthographic projection of the second extension part on the base substrate in the row direction is larger than a size of an orthographic projection of the third extension part on the base substrate in the row direction;

wherein, in a same repeating unit, second extension parts in two adjacent third power lines are connected to each other, and two adjacent third conductive parts in two repeating units adjacent in the row direction are connected to each other.

15. The display panel according to claim 1, wherein the display panel comprises more than one pixel driving circuit, and the more than one pixel driving circuit is distributed in an array along the first direction and a second direction, and the first direction intersects with the second direction;

the pixel driving circuit further comprises a fifth transistor, a first electrode of the fifth transistor is connected to a third power line, a second electrode of the fifth transistor is connected to the first electrode of the driving transistor, and the display panel further comprises:

a third conductive layer, located on a side of the second conductive layer away from the base substrate, wherein the third conductive layer comprises a power connection line, an orthographic projection of the power connection line on the base substrate extends along the first direction, the power connection line is connected to more than one third conductive part respectively through a via hole, and orthographic projections of more than one third conductive part connected to a same power connection line on the base substrate are distributed at intervals along the first direction; and a fourth conductive layer, located on a side of the third conductive layer away from the base substrate, wherein the fourth conductive layer comprises the third power line, an orthographic projection the third power line on the base substrate extends along the second direction, and the third power line is connected to the power connection line that intersects with the orthographic projection of the third power line on the base substrate.

16. The display panel according to claim 1, wherein the display panel further comprises a light emitting unit, and the pixel driving circuit further comprises a fifth transistor, a sixth transistor, a seventh transistor and an eighth transistor;

a first electrode of the fifth transistor is connected to a third power line, and a second electrode of the fifth transistor is connected to the first electrode of the driving transistor;

a first electrode of the sixth transistor is connected to the second electrode of the driving transistor, and a second electrode of the sixth transistor is connected to a first electrode of the light emitting unit;

a first electrode of the seventh transistor is connected to a second initial signal line, and a second electrode of the seventh transistor is connected to the first electrode of the light emitting unit;

a first electrode of the eighth transistor is connected to a third initial signal line, and a second electrode of the eighth transistor is connected to the first electrode of the driving transistor;

the fifth transistor, the sixth transistor, the seventh transistor, and the eighth transistor are first type transistors;

the first type transistor is a P-type transistor, and the second type transistor is an N-type transistor.

17. A display device, comprising a display panel, wherein the display panel comprises a pixel driving circuit, the pixel driving circuit comprises a first type transistor and a second type transistor, and the display panel further comprises:

a base substrate;

a first active layer, located on a side of the base substrate, wherein at least a partial structure of the first active layer is used to form a channel region of the first type transistor;

a second active layer, located on a side of the first active layer away from the base substrate, wherein at least a partial structure of the second active layer is used to form a channel region of the second type transistor; and a first conductive layer, located between the first active layer and the second active layer, wherein a partial structure of the first conductive layer is used to form a gate of the first type transistor, and another partial structure of the first conductive layer is used to form a bottom gate of the second type transistor;

wherein the pixel driving circuit further comprises a capacitor, the first conductive layer comprises a first conductive part, and the first conductive part is used to form a first electrode of the capacitor; and the display panel further comprises: a second conductive layer, located on a side of the second active layer away from the base substrate, wherein the second conductive layer comprises a third conductive part, an orthographic projection of the third conductive part on the base substrate at least partially overlaps with an orthographic projection of the first conductive part on the base substrate, and the third conductive part is used to form a second electrode of the capacitor; wherein, a partial structure of the second conductive layer is further used to form a top gate of the second type transistor;

wherein the pixel driving circuit further comprises a driving transistor, a first transistor, and a second transistor, the driving transistor is the first type transistor, and the first transistor and the second transistor are second type transistors; a first electrode of the first transistor is connected to a first initial signal line, a second electrode of the first transistor is connected to a gate of the driving transistor, a first electrode of the second transistor is connected to the gate of the driving transistor, a second electrode of the second transistor is connected to a second electrode of the driving transistor, and the first electrode of the capacitor is connected to the gate of the driving transistor; the first active layer comprises a third active part used to form a channel region of the driving transistor; the second active layer comprises a first active part and a second active part, the first active part is used to form a channel region of the first transistor, and the second active part is used to forming a channel region of the second transistor; the first conductive layer further comprises a first gate line, and a first reset signal line; wherein, the orthographic projection of the first conductive part on the base substrate covers an orthographic projection of the third active part on the base substrate, and the first conductive part is further used to form the gate of the driving transistor; an orthographic projection of the first reset signal line on the base substrate covers an orthographic projection of the first active part on the base substrate, and a partial structure of the first reset signal line is used to form a bottom gate of the first transistor; an orthographic projection of the first gate line on the base substrate covers an orthographic projection of the second active part on the base substrate, and a partial structure of the first gate line is used to form a bottom gate of the second transistor; the second conductive layer further comprises a third gate line, and a third reset signal line; wherein, an orthographic projection of the third reset signal line on the base substrate covers the orthographic projection of the first active part on the base substrate, and a partial structure of the third reset signal line is used to form a top gate of the first transistor; an orthographic projection of the third gate line on the base substrate covers the orthographic projection of the second active part on the base substrate, and a partial structure of the third gate line is used to form the bottom gate of the second transistor;

wherein the pixel driving circuit further comprises a fourth transistor, a first electrode of the fourth transistor is connected to a data line, and a second electrode of the fourth transistor is connected to a first electrode of the driving transistor, and the fourth transistor is the first type transistor; the first active layer further comprises a fourth active part used to form a channel region of the fourth transistor; the first conductive layer further comprises a second gate line, an orthographic projection of the second gate line on the base substrate covers an orthographic projection of the fourth active part on the base substrate, and a partial structure of the second gate line is used to form a gate of the fourth transistor; wherein, the orthographic projection of the first gate line on the base substrate, the orthographic projection of the second gate line on the base substrate, and the orthographic projection of the first reset signal line on the base substrate all extend along a first direction; the orthographic projection of the second gate line on the base substrate is located on a side of the orthographic projection of the first gate line on the base substrate away from the orthographic projection of the first conductive part on the base substrate; the orthographic projection of the first reset signal line on the base substrate is located on a side of the orthographic projection of the second gate line on the base substrate away from the orthographic projection of the first conductive part on the base substrate.

* * * * *